US011908521B2

(12) United States Patent
Li et al.

(10) Patent No.: US 11,908,521 B2
(45) Date of Patent: Feb. 20, 2024

(54) NON-VOLATILE MEMORY WITH REDUNDANT CONTROL LINE DRIVER

(71) Applicant: WESTERN DIGITAL TECHNOLOGIES, INC., San Jose, CA (US)

(72) Inventors: Liang Li, Shanghai (CN); Qin Zhen, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 186 days.

(21) Appl. No.: 17/589,973

(22) Filed: Feb. 1, 2022

(65) Prior Publication Data
US 2023/0245703 A1 Aug. 3, 2023

(51) Int. Cl.
G11C 16/04 (2006.01)
G11C 16/08 (2006.01)
H02M 3/07 (2006.01)
G11C 29/12 (2006.01)
G11C 16/30 (2006.01)
H01L 25/065 (2023.01)
H10B 43/27 (2023.01)

(52) U.S. Cl.
CPC .......... *G11C 16/08* (2013.01); *G11C 16/0483* (2013.01); *G11C 16/30* (2013.01); *G11C 29/12005* (2013.01); *H02M 3/07* (2013.01); *H01L 25/0657* (2013.01); *H01L 2225/06562* (2013.01); *H10B 43/27* (2023.02)

(58) Field of Classification Search
CPC ............ G11C 2029/1202; G11C 16/30; G11C 29/12005; G11C 16/08
See application file for complete search history.

(56) References Cited

U.S. PATENT DOCUMENTS

| | | | |
|---|---|---|---|
| 5,161,120 A | 11/1992 | Kajimoto | |
| 5,428,621 A | 6/1995 | Mehrotra | |
| 5,436,587 A | 7/1995 | Cernea | |
| 5,526,307 A | 6/1996 | Yiu | |
| 5,652,725 A | 7/1997 | Suma | |
| 6,041,002 A * | 3/2000 | Maejima | G11C 29/50 365/201 |
| 6,370,075 B1 | 4/2002 | Haeberli | |
| 6,504,744 B2 | 1/2003 | Aritomi | |
| 7,030,683 B2 | 4/2006 | Pan | |
| 7,499,352 B2 | 3/2009 | Singh | |

(Continued)

FOREIGN PATENT DOCUMENTS

JP 2014142989 A 8/2014

OTHER PUBLICATIONS

PCT International Search Report and Written Opinion dated Oct. 25, 2022, PCT Patent Application No. PCT/US2022/030411.

*Primary Examiner* — Uyen Smet
(74) *Attorney, Agent, or Firm* — Vierra Magen Marcus LLP

(57) ABSTRACT

A non-volatile memory includes memory cells, word lines connected to the memory cells, and a set of regular control gate drivers connected to the word lines. The control gate drivers include different subsets of control gate drivers that receive different sources of voltage and provide different output voltages. A redundant control gate driver, that receives the different sources of voltage and provides the different output voltages, is included that can replace any of the regular control gate drivers.

18 Claims, 28 Drawing Sheets

(56) References Cited

U.S. PATENT DOCUMENTS

| | | |
|---|---|---|
| 7,554,311 B2 | 6/2009 | Pan |
| 8,339,185 B2 | 12/2012 | Cazzaniga |
| 9,164,526 B2 | 10/2015 | Pan |
| 9,449,703 B1 | 9/2016 | Roy et al. |
| 10,347,355 B2 | 7/2019 | Sohn |
| 2007/0126494 A1 | 6/2007 | Pan |
| 2007/0139099 A1 | 6/2007 | Pan |
| 2010/0019832 A1 | 1/2010 | Pan |
| 2012/0069668 A1 | 3/2012 | Hatsuda |
| 2012/0069683 A1 | 3/2012 | Kamata et al. |
| 2013/0063118 A1 | 3/2013 | Nguyen |
| 2014/0078847 A1* | 3/2014 | Porter ................. G11C 11/4085 365/230.06 |
| 2017/0133108 A1* | 5/2017 | Lee ........................ G11C 29/04 |
| 2021/0389879 A1 | 12/2021 | Inbar et al. |

\* cited by examiner

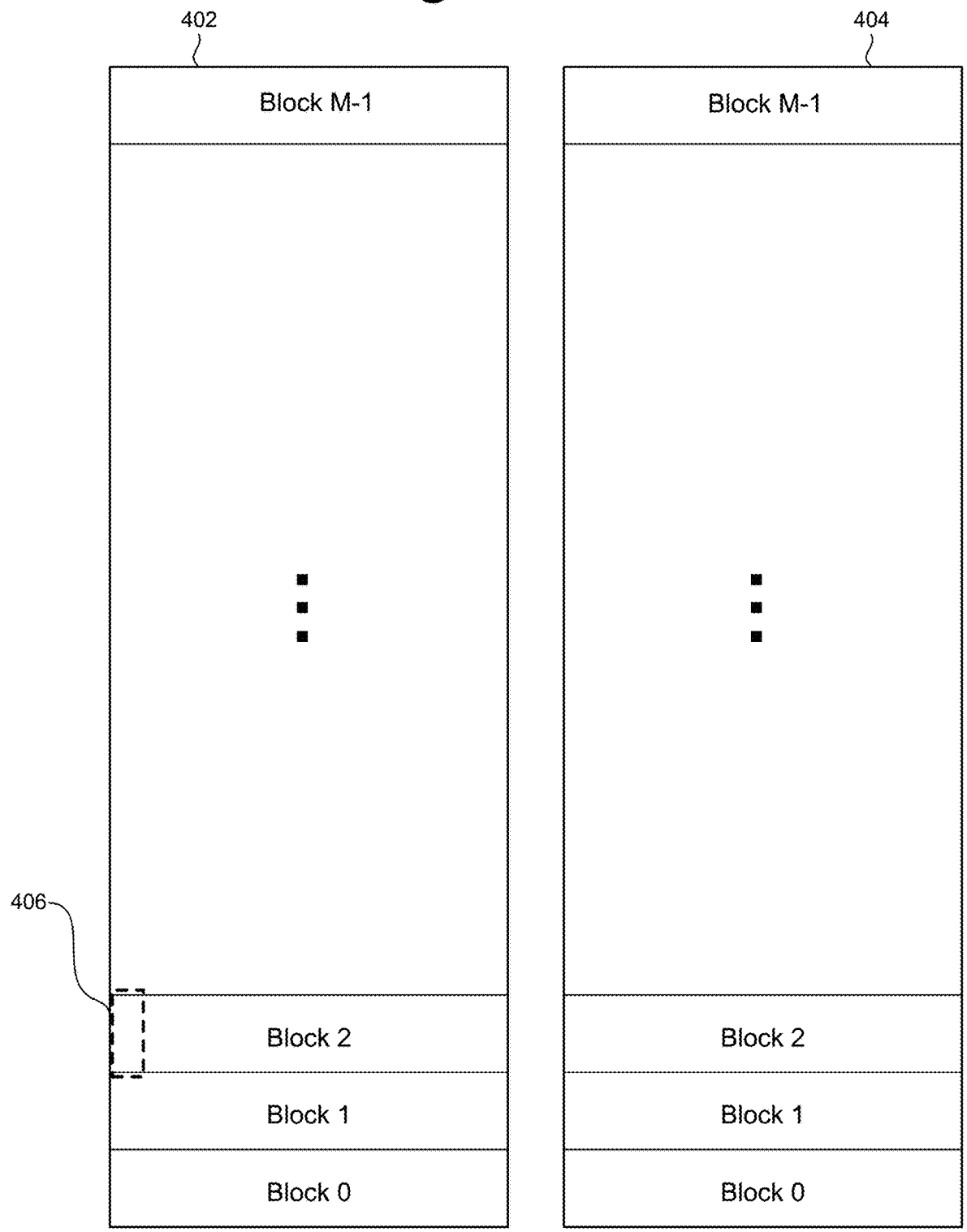

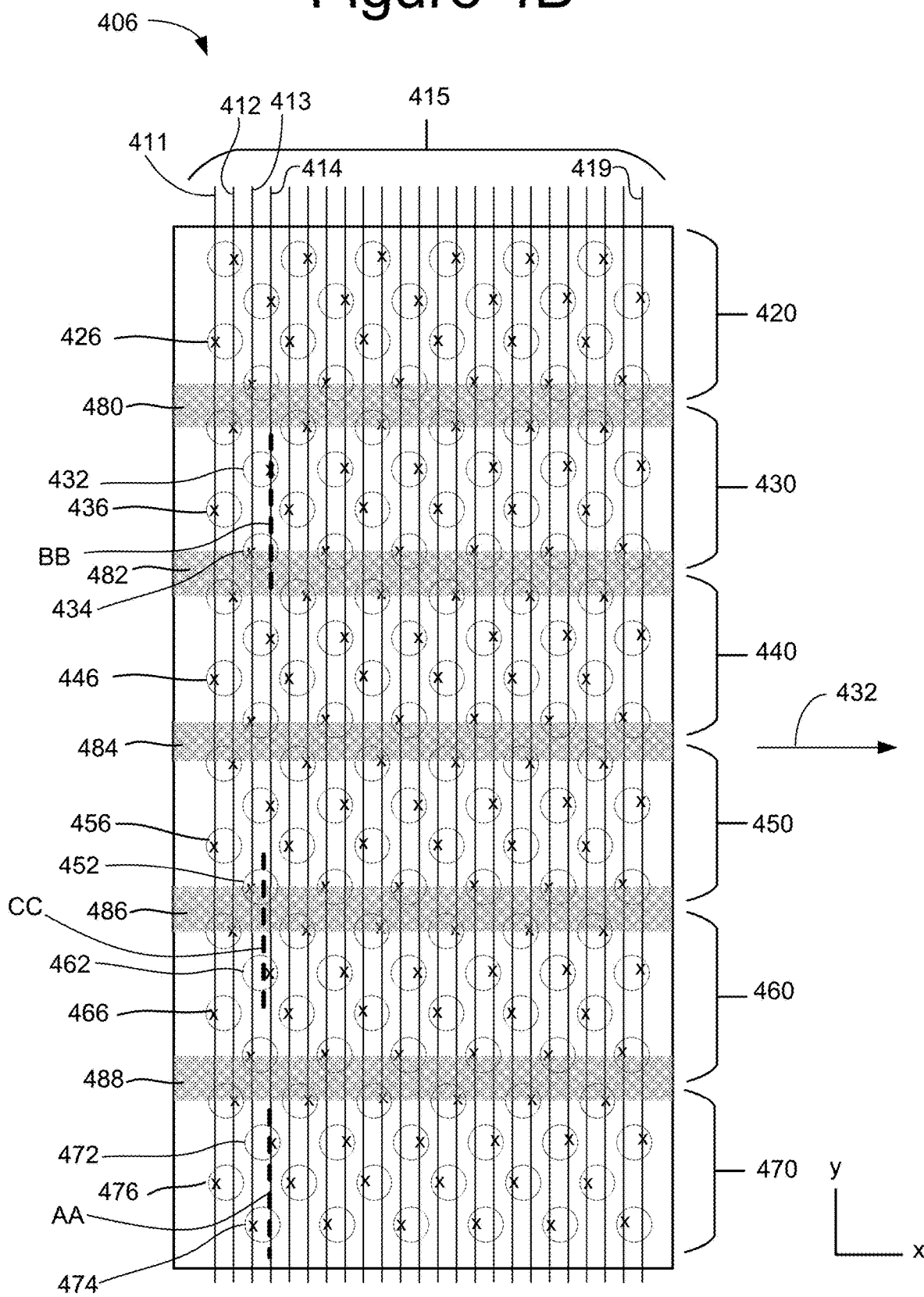

Figure 15

| path 7 | path 6 | path 5 | path 4 | path 3 | path 2 | path 1 | path 0 |
| --- | --- | --- | --- | --- | --- | --- | --- |
| path 15 | path 14 | path 13 | path 12 | path 11 | path 10 | path 9 | path 8 |
| path 23 | path 22 | path 21 | path 20 | path 19 | path 18 | path 17 | path 16 |
| ... | | | | | | | |
| path M | path M-1 | path M-2 | path M-3 | path M-4 | path M-5 | path M-6 | path M-7 |
| driver 8 | driver 7 | driver 6 | driver 5 | driver 4 | driver 3 | driver 2 | driver 1 |
| driver 16 | driver 15 | driver 14 | driver 13 | driver 12 | driver 11 | driver 10 | driver 9 |
| ... | | | | | | | |
| driver N | driver N-1 | driver N-2 | driver N-3 | driver N-4 | driver N-5 | driver N-6 | driver N-7 |

NON-VOLATILE MEMORY WITH REDUNDANT CONTROL LINE DRIVER

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Non-volatile storage systems typically include non-volatile memory cells, word lines connected to the memory cells, and a set of control gate drivers connected to the word lines. The control gate drivers are required to drive many different voltages on the word lines, depending on the memory operation (e.g., program/write, read, erase) and the target of the memory operation. If any of the control gate drivers fail (e.g., due to a defect in the control gate driver), there is a risk that the non-volatile storage system will not be operable.

BRIEF DESCRIPTION OF THE DRAWINGS

Like-numbered elements refer to common components in the different figures.

FIG. 4A is a block diagram of one embodiment of a memory structure having two planes.

FIG. 4B depicts a top view of a portion of one embodiment of a block of memory cells.

FIG. 15 depicts one embodiment of a data structure that indicates whether each path of each control gate driver of the set of control gate drivers is defective.

DETAILED DESCRIPTION

To prevent the failure of a control gate driver from rendering a non-volatile storage system inoperable, it is proposed to utilize one or more redundant control gate drivers. The control gate drivers of a non-volatile storage system typically include different subsets of control gate drivers that receive different sources of voltage and provide different output voltages. A redundant control gate driver that receives all of the different sources of voltage and provides all of the different output voltages can replace any of the regular control gate drivers.

One embodiment of a non-volatile storage system includes non-volatile memory cells, word lines connected to the memory cells, a set of regular control gate drivers, a plurality of switches connected to the word lines and the regular control gate drivers, and a redundant control gate driver connected to the plurality of switches. Each regular control gate driver of the set of regular control gate drivers is capable of outputting a plurality of output voltages such that a first subset of the set of regular control gate drivers are configured to output a first plurality of output voltages and a second subset of the set of regular control gate drivers are configured to output a second plurality of output voltages. The first plurality of output voltages includes one or more different voltages than the second plurality of output voltages. The redundant control gate driver is configured to output the first plurality of output voltages and the second plurality of output voltages. The plurality of switches are configured to selectively replace any one of the regular control gate drivers of the set of regular control gate drivers with the redundant control gate driver.

Figure 1:
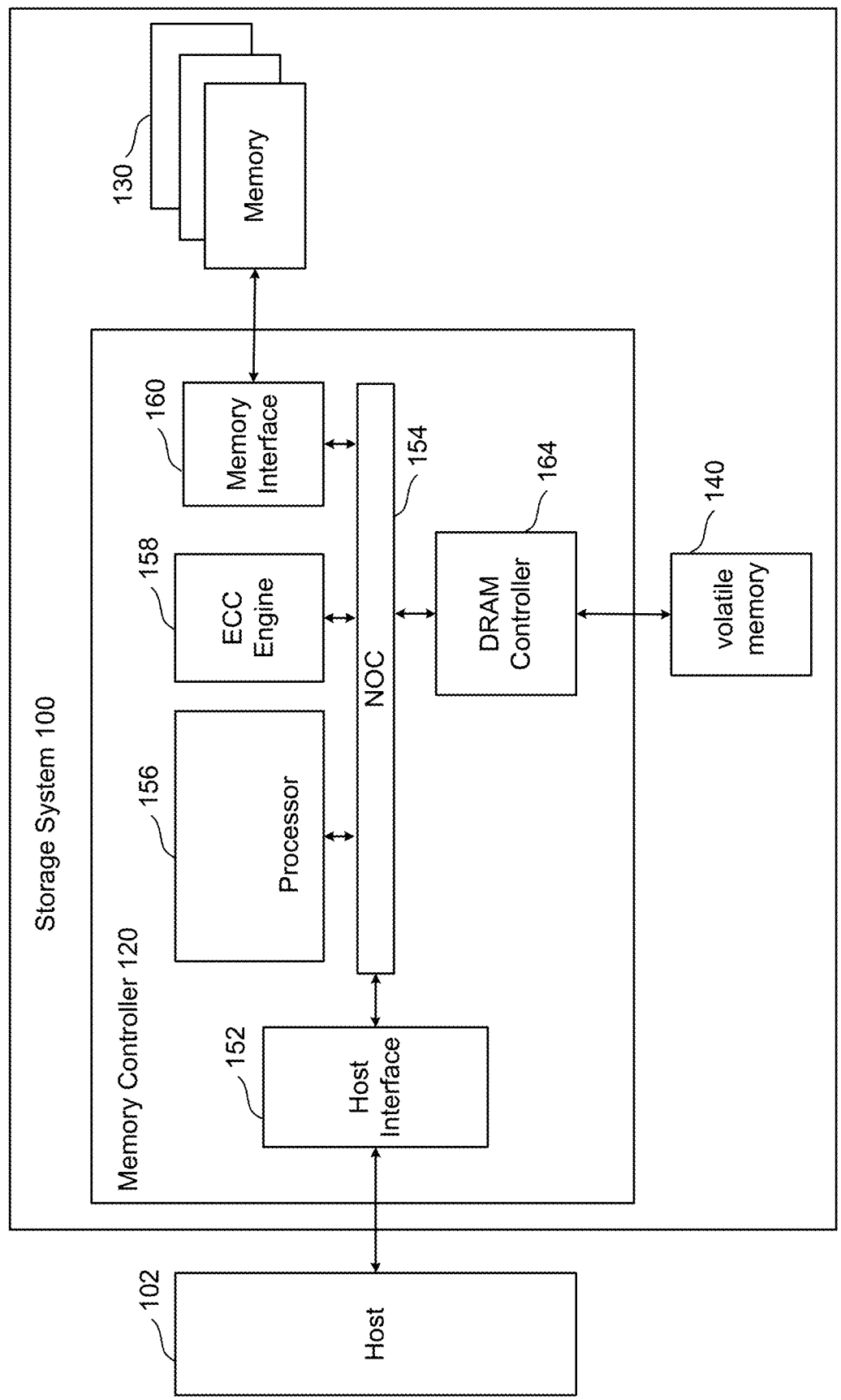
FIG. 1 is a block diagram depicting one embodiment of a storage system.

FIG. 1 is a block diagram of one embodiment of a non-volatile storage system 100 that implements the proposed technology described herein. In one embodiment, non-volatile storage system 100 is a solid state drive ("SSD"). Non-volatile storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
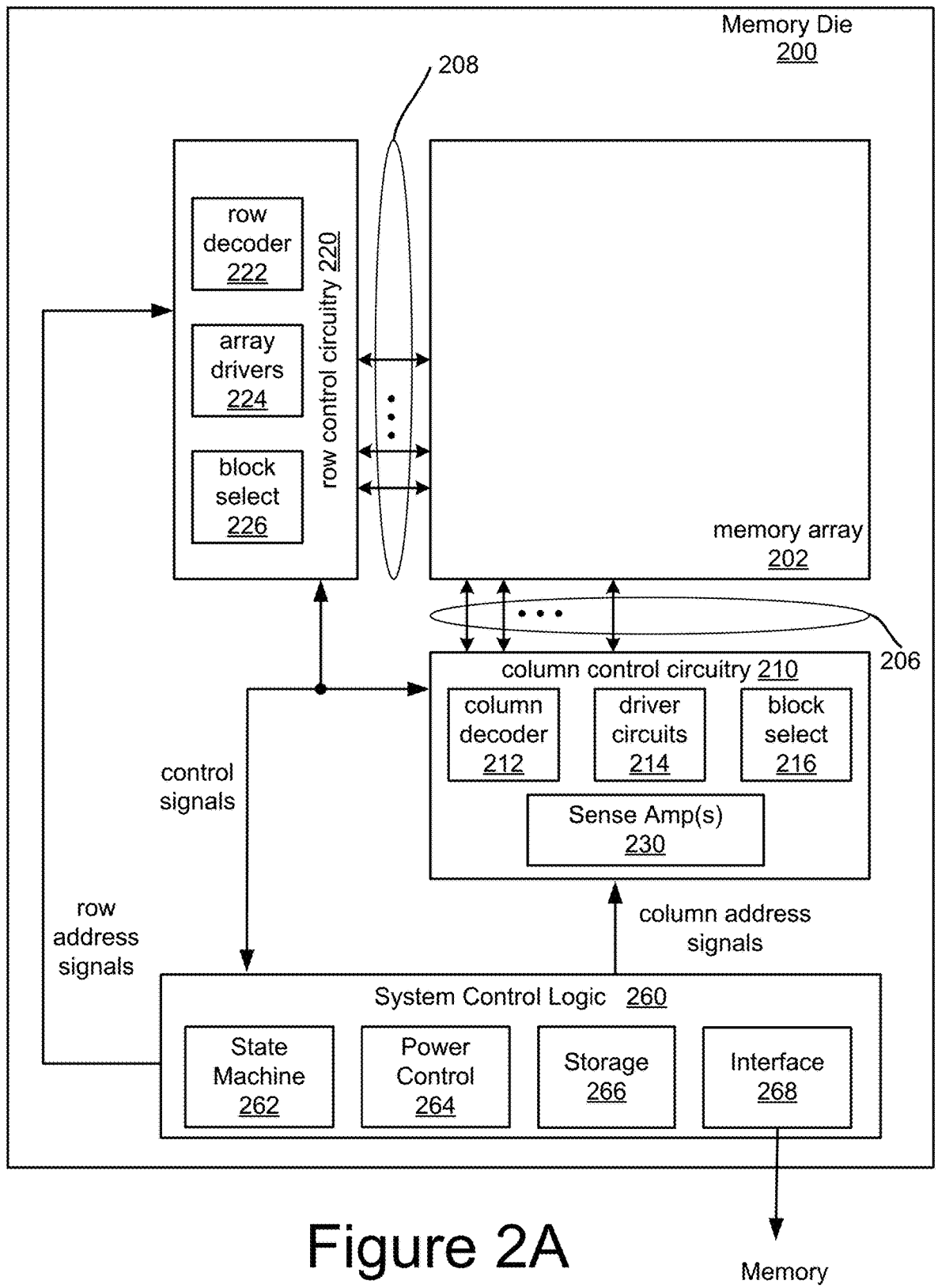
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ CMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
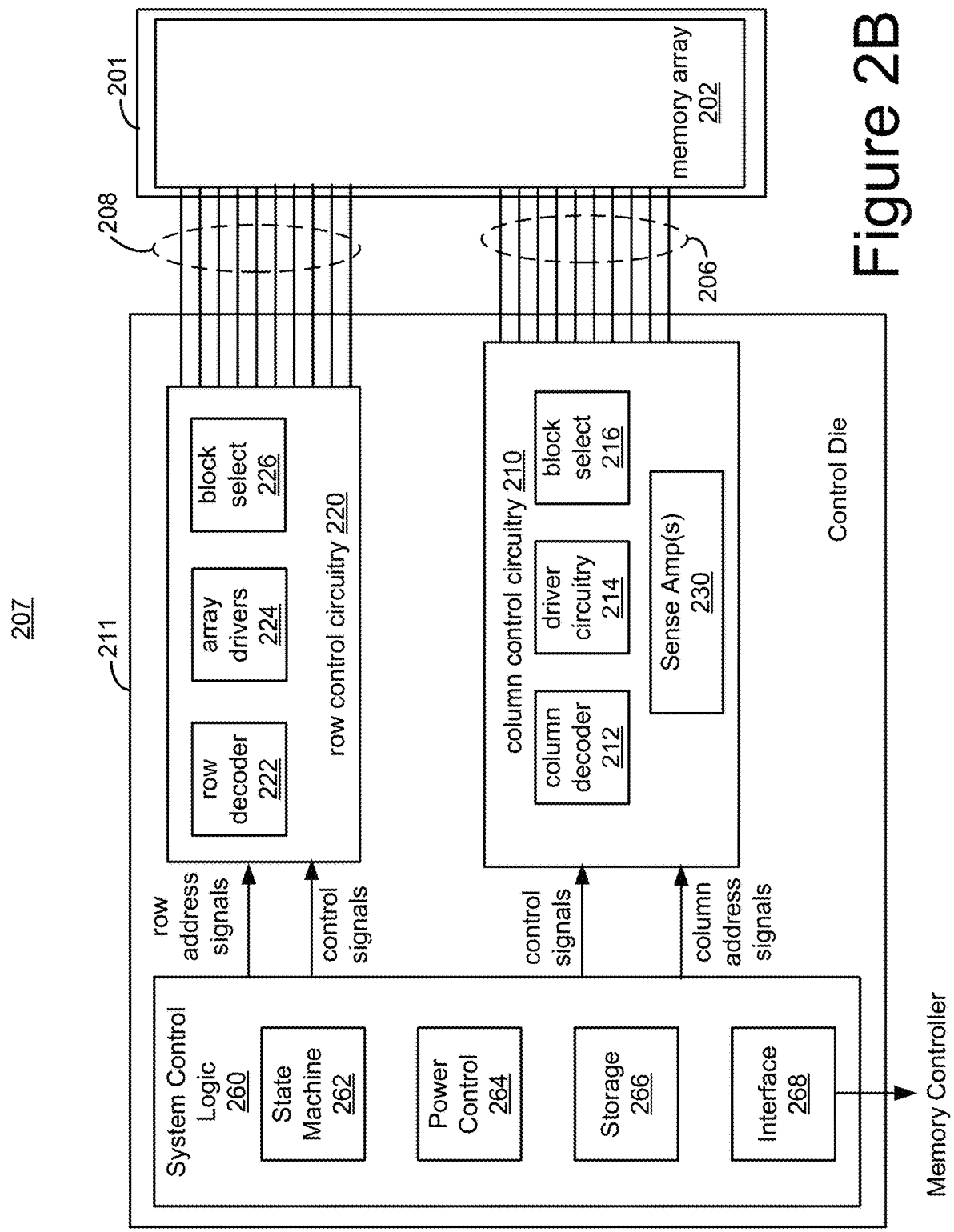
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
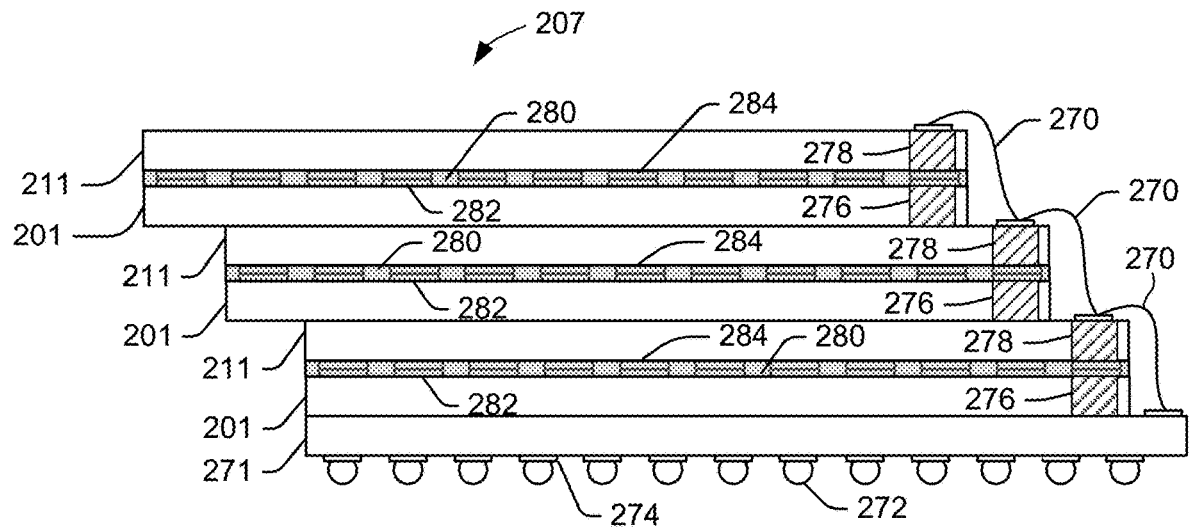
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
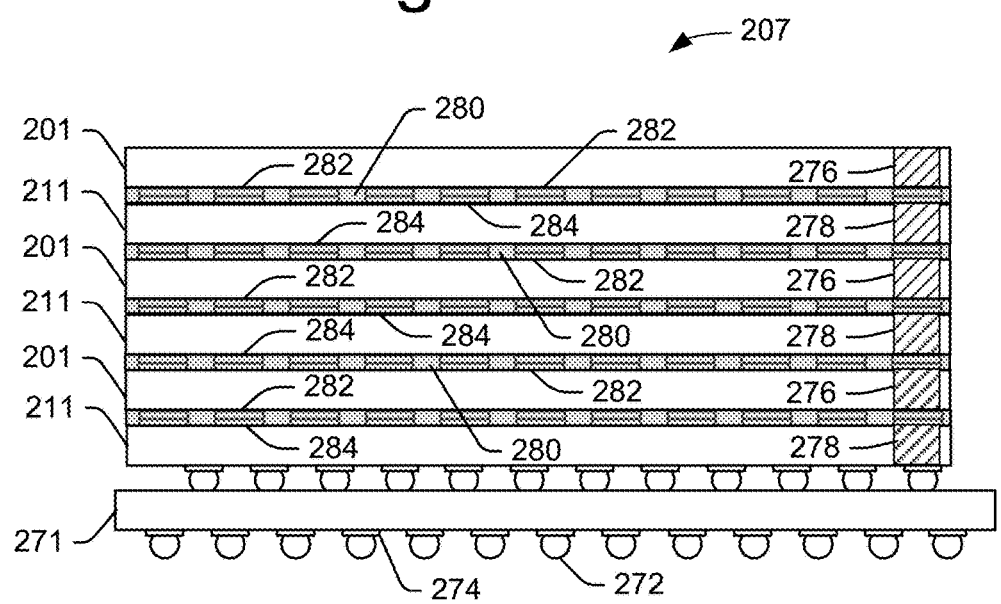

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
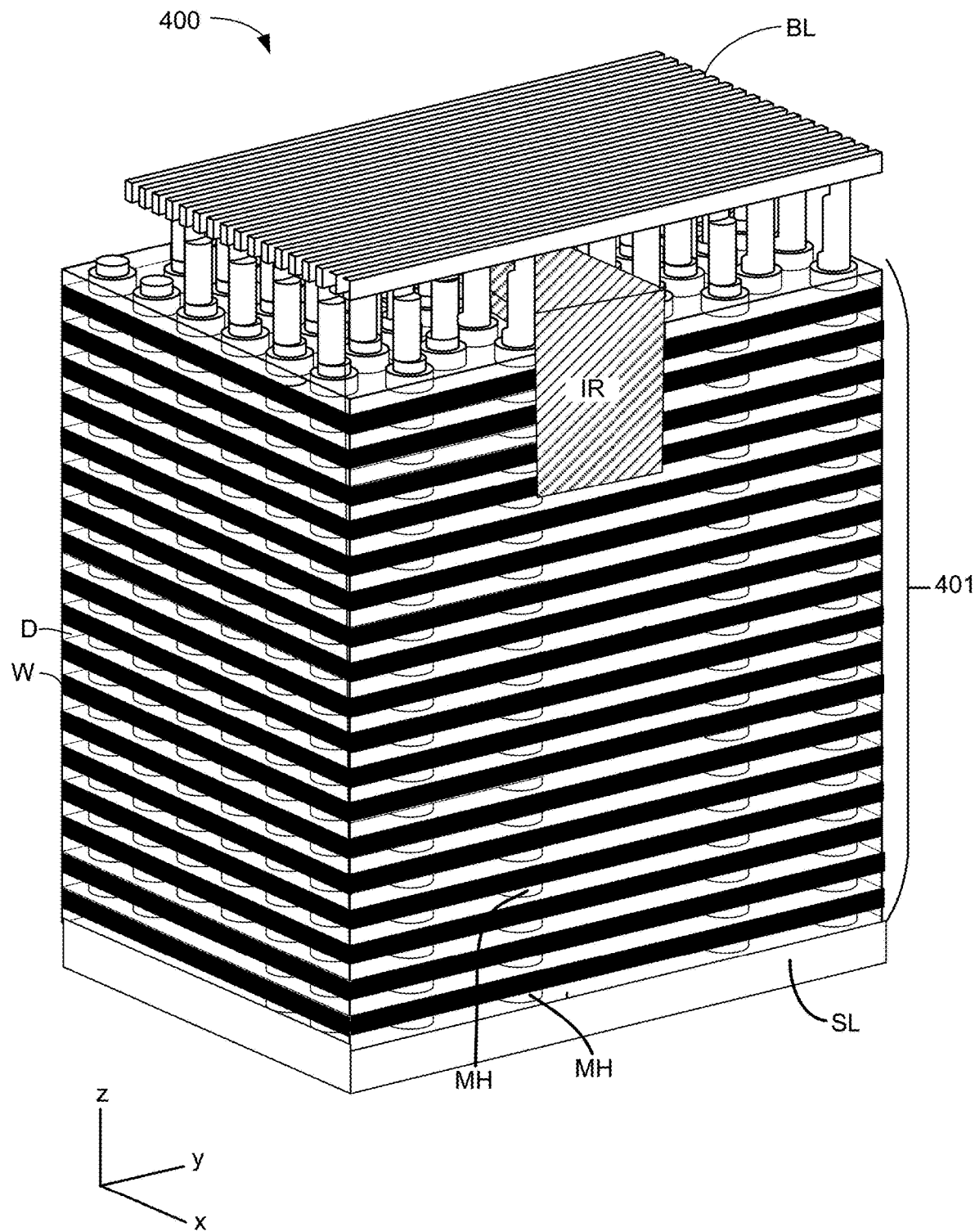
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes eight or more planes.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
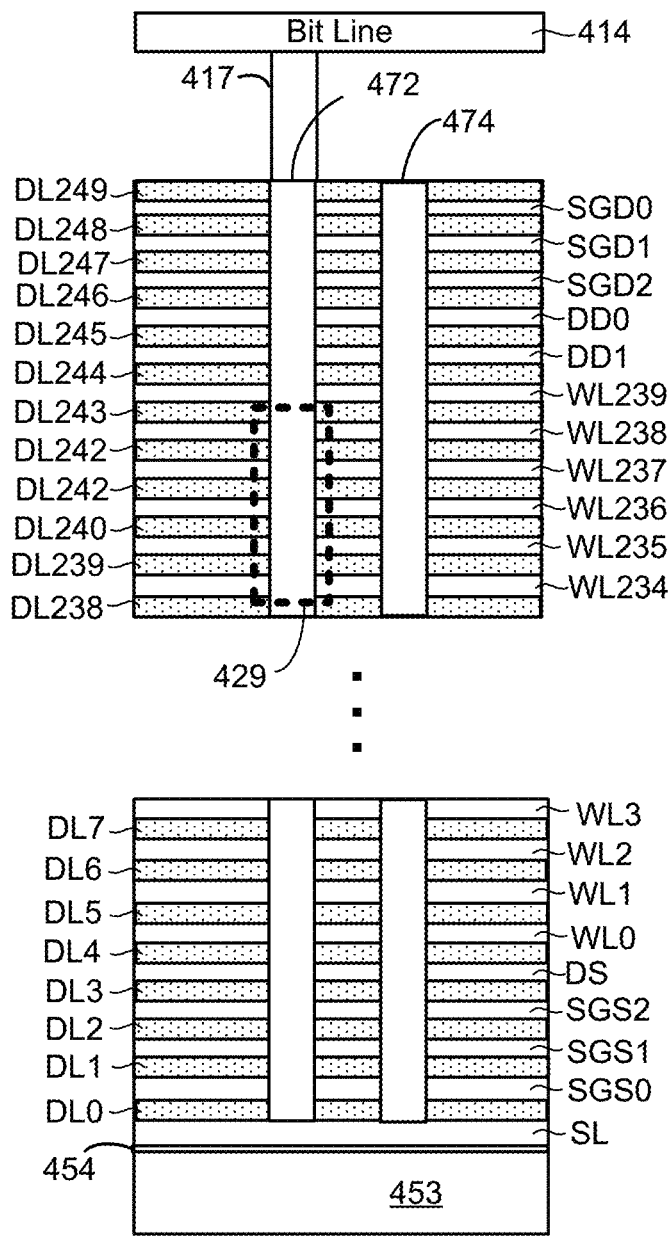
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2 (that form select lines); three source side select layers SGS0, SGS1, and SGS2 (that form select lines); three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
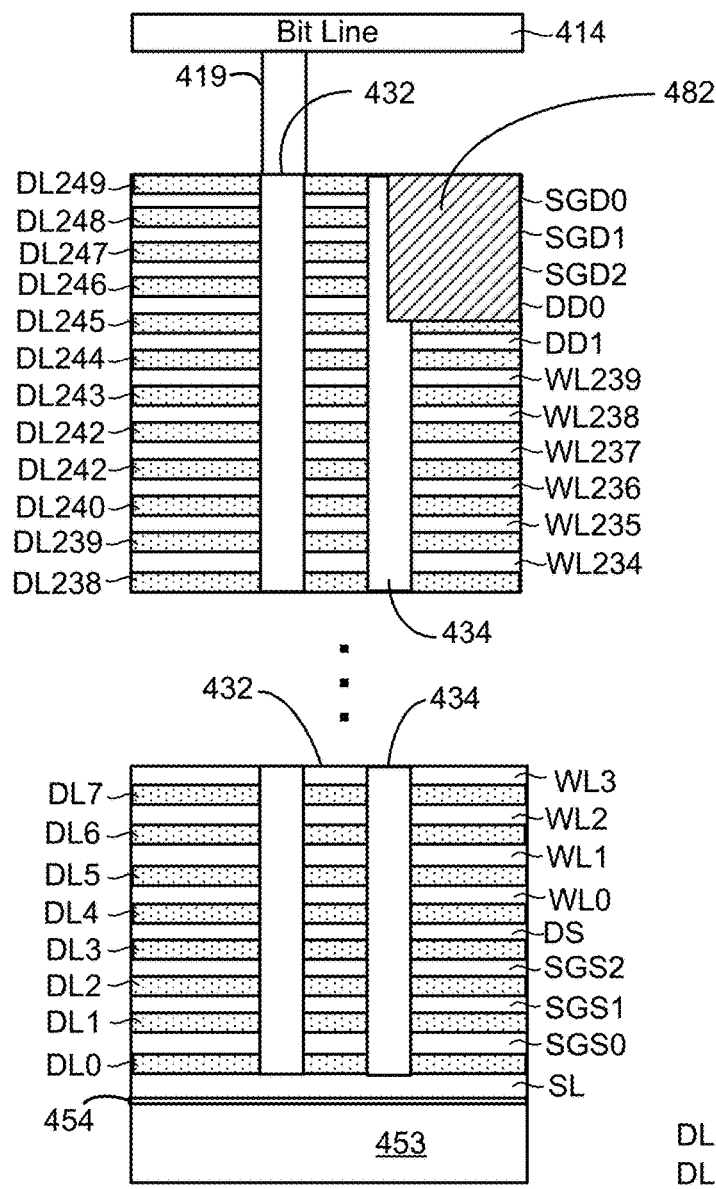
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/ NAND strings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
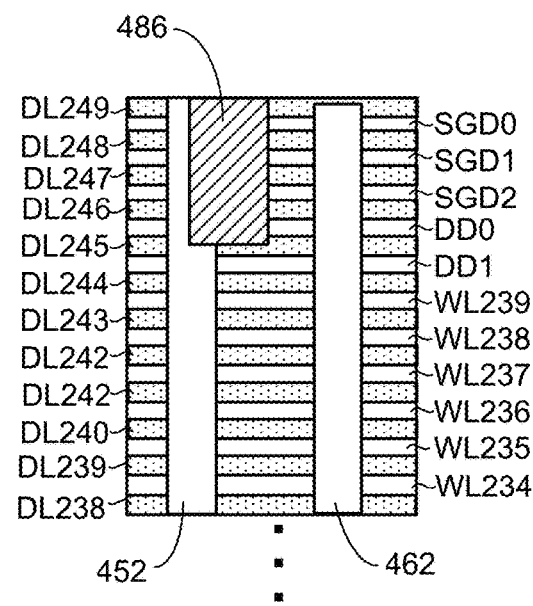
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
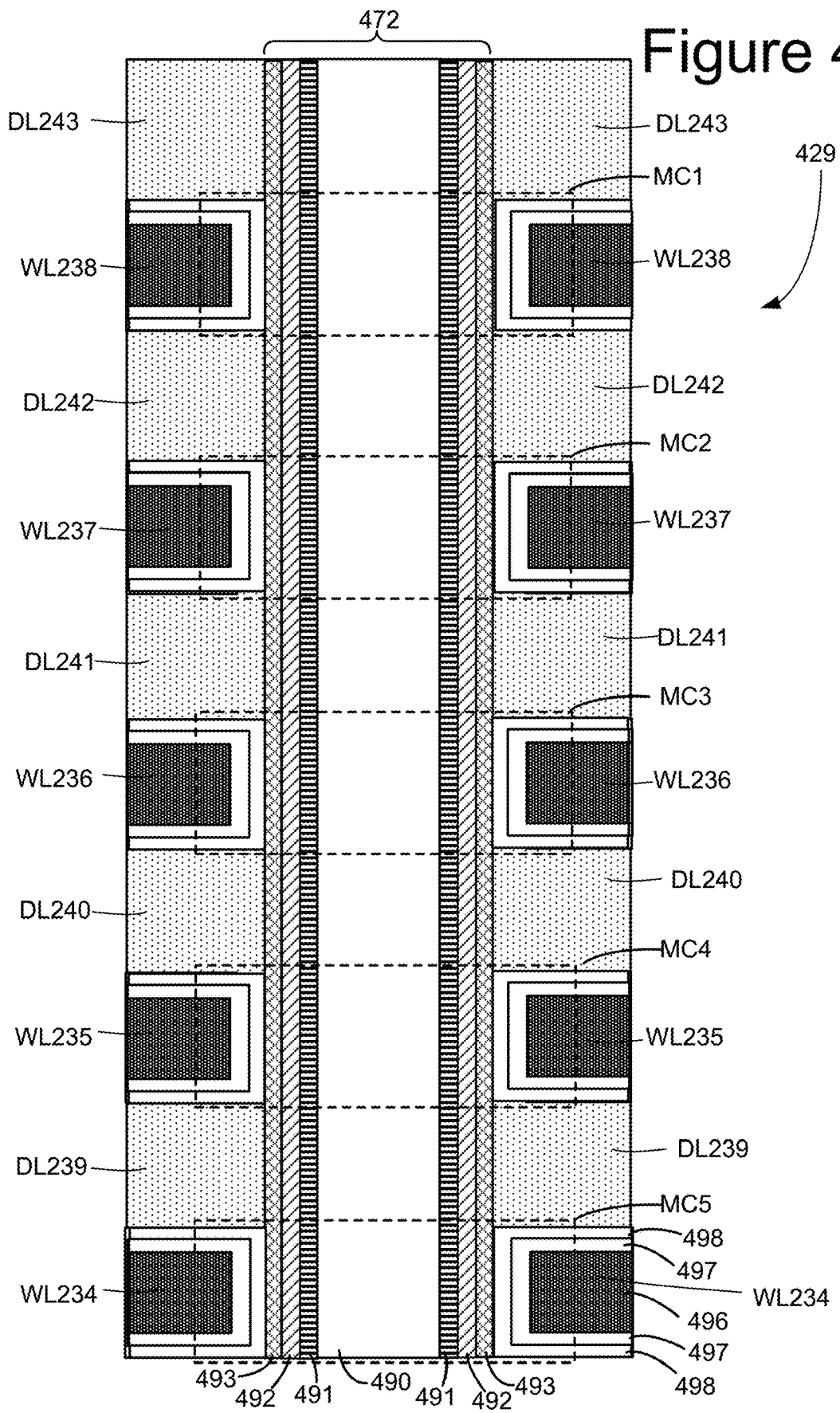
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL239, DL240, DL241, DL242 and DLL43, as well as word line layers WL234, WL235, WL236, WL237, and WL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL238 and a portion of vertical column 472 comprise a memory cell MC1. Word line layer WL237 and a portion of vertical column 472 comprise a memory cell MC2. Word line layer WL236 and a portion of vertical column 472 comprise a memory cell MC3. Word line layer WL235 and a portion of vertical column 472 comprise a memory cell MC4. Word line layer WL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
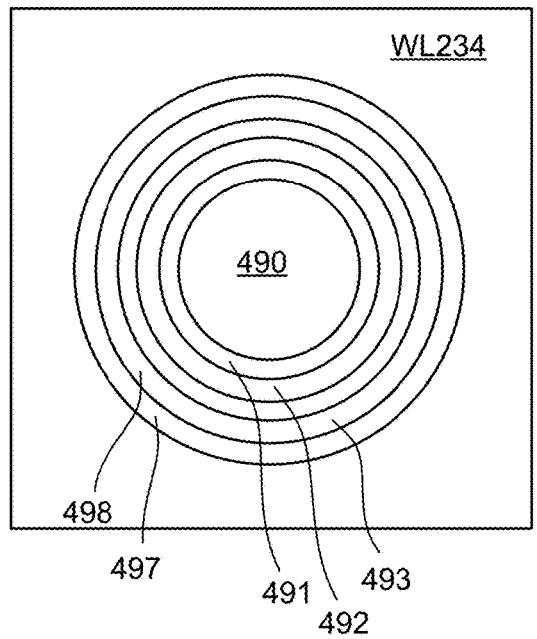
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
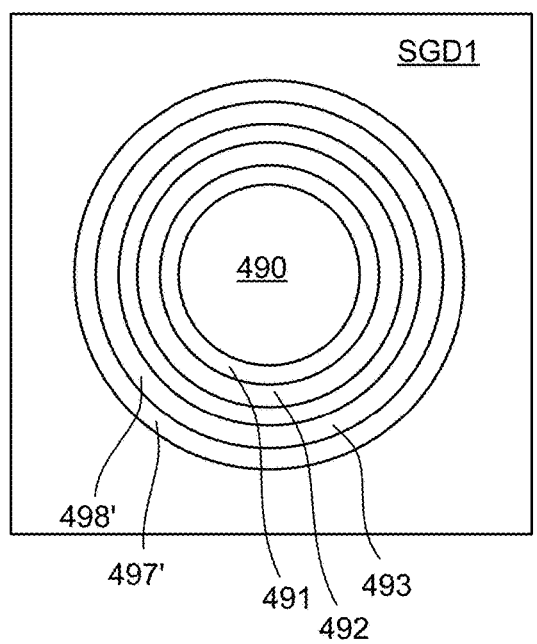
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
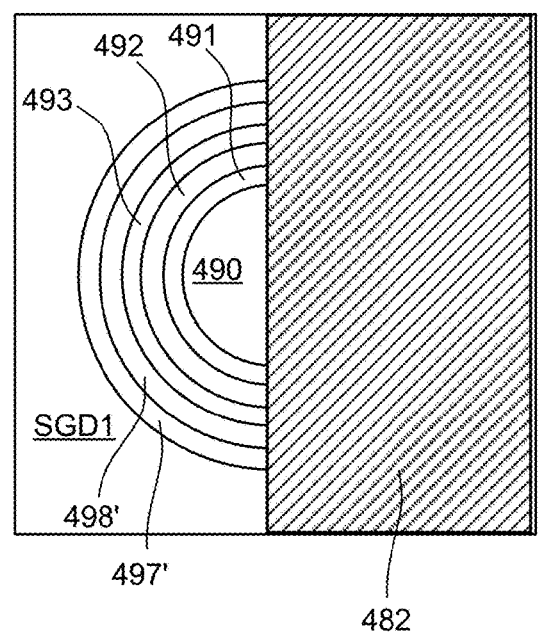
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
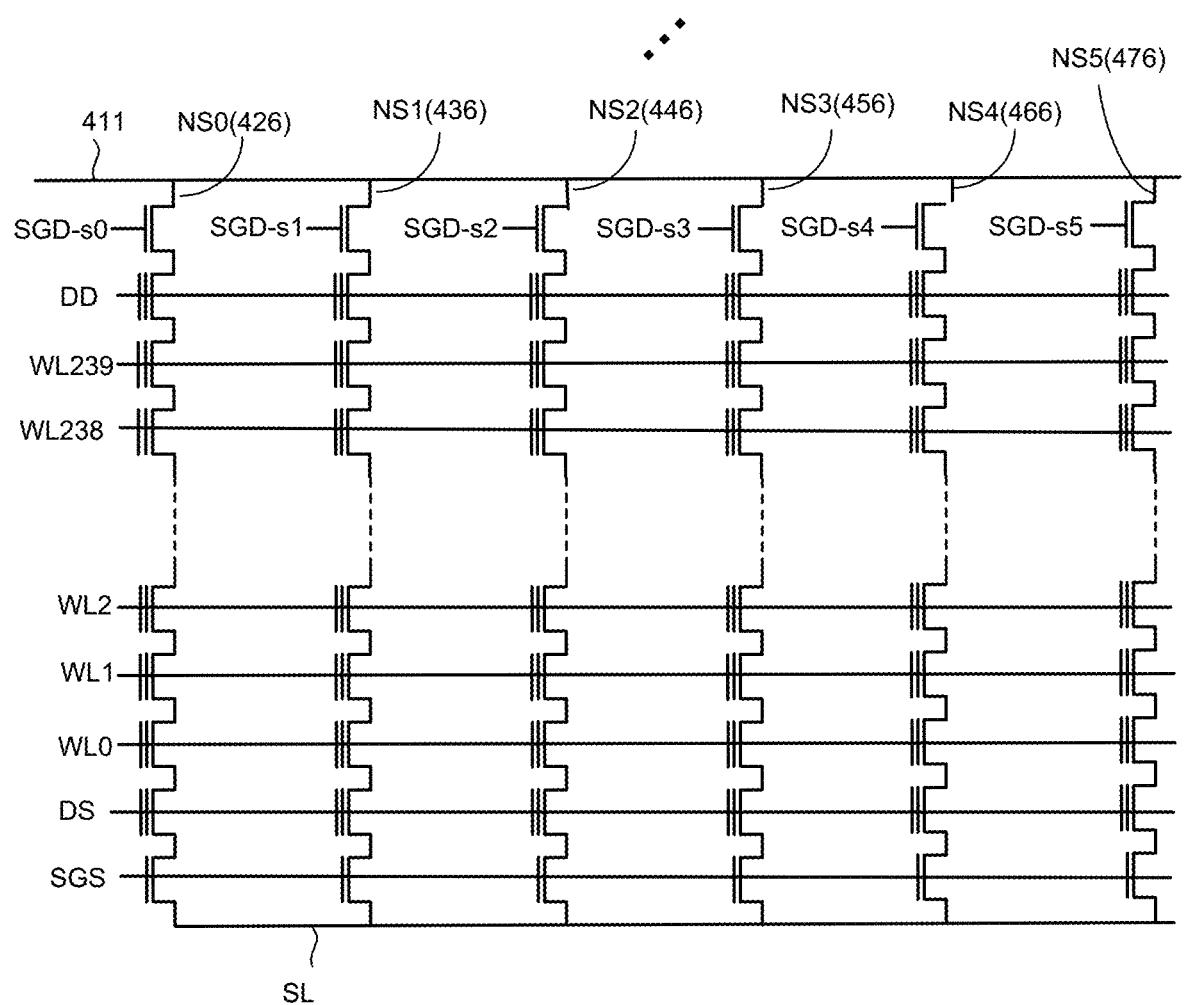
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
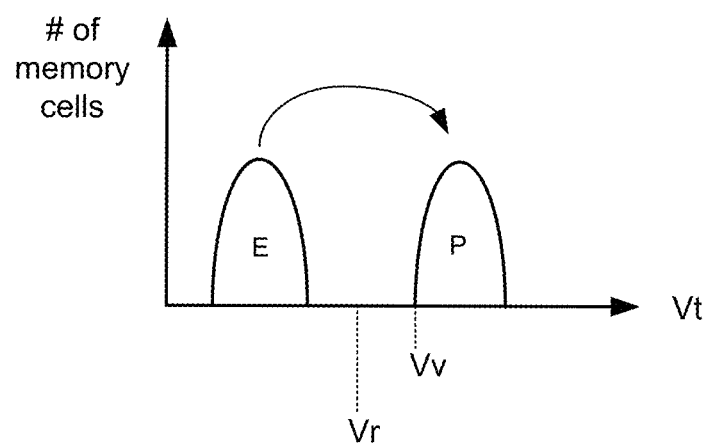
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
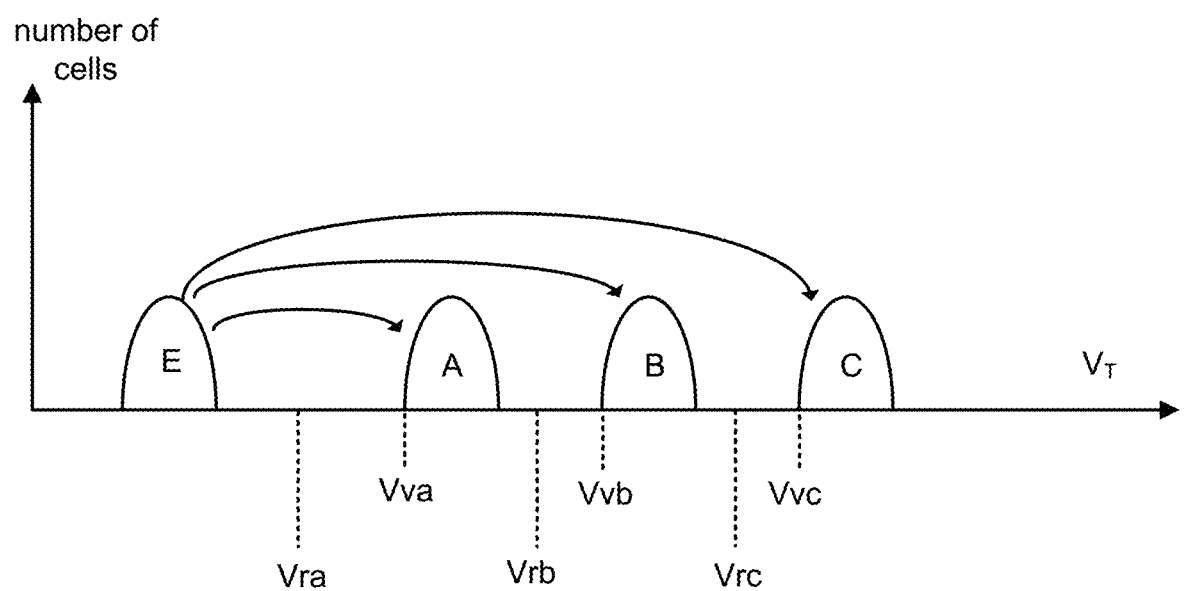
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
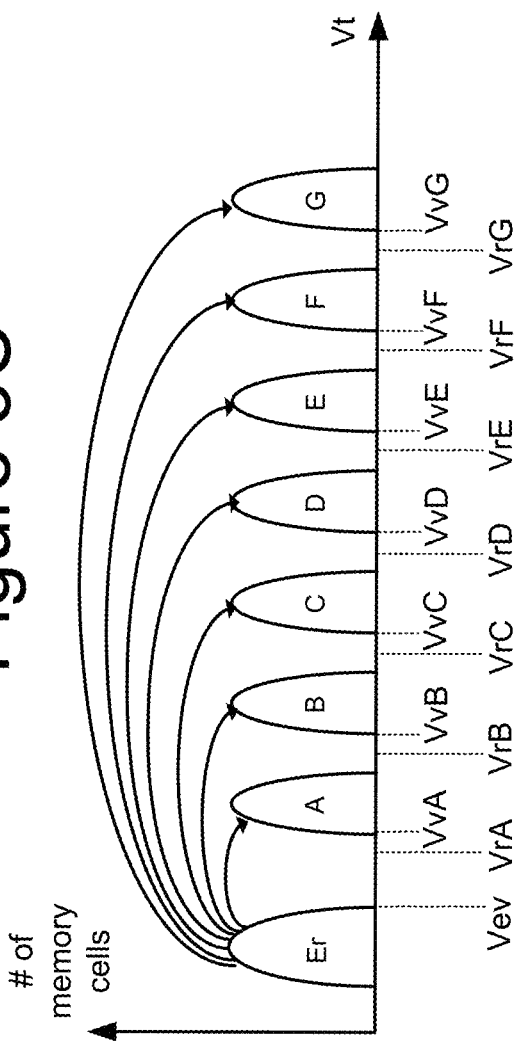
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
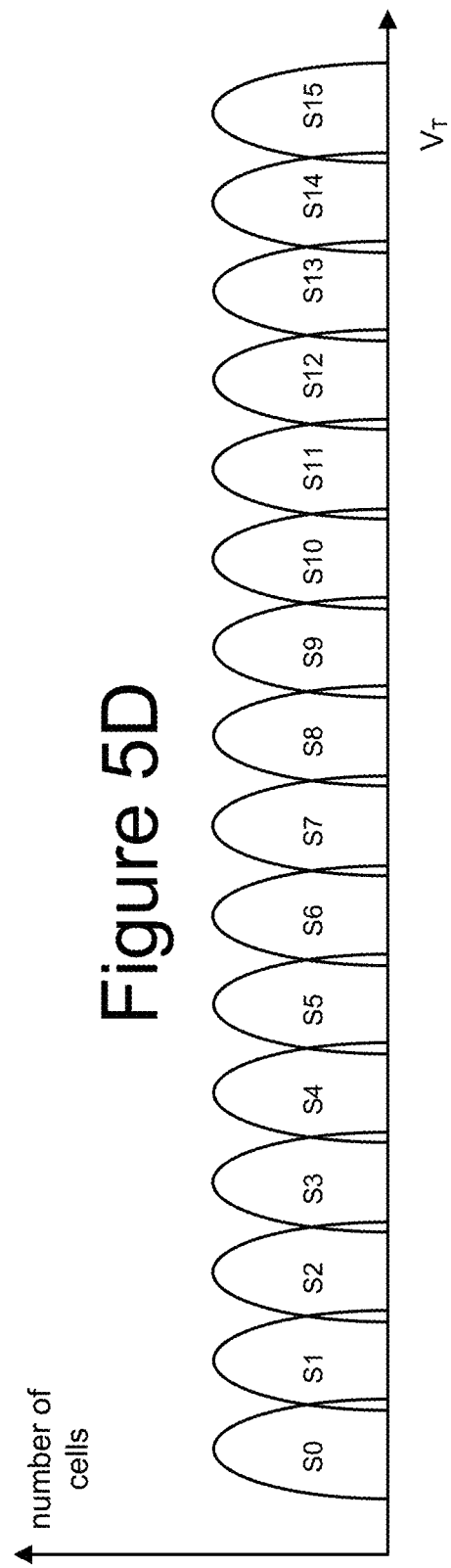
FIG. 5D depicts threshold voltage distributions.
Figure 5E:
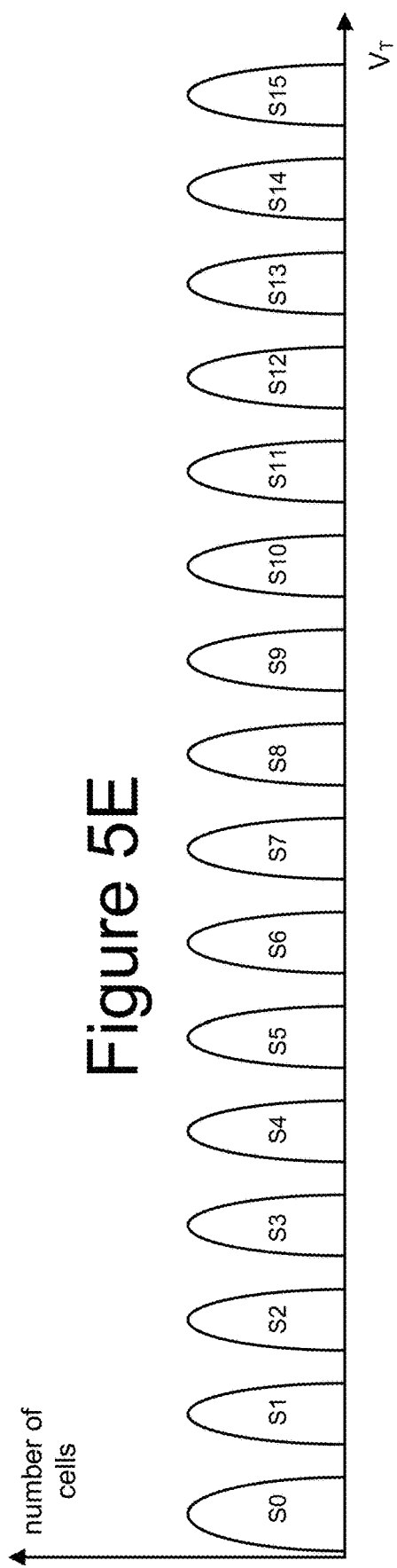
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
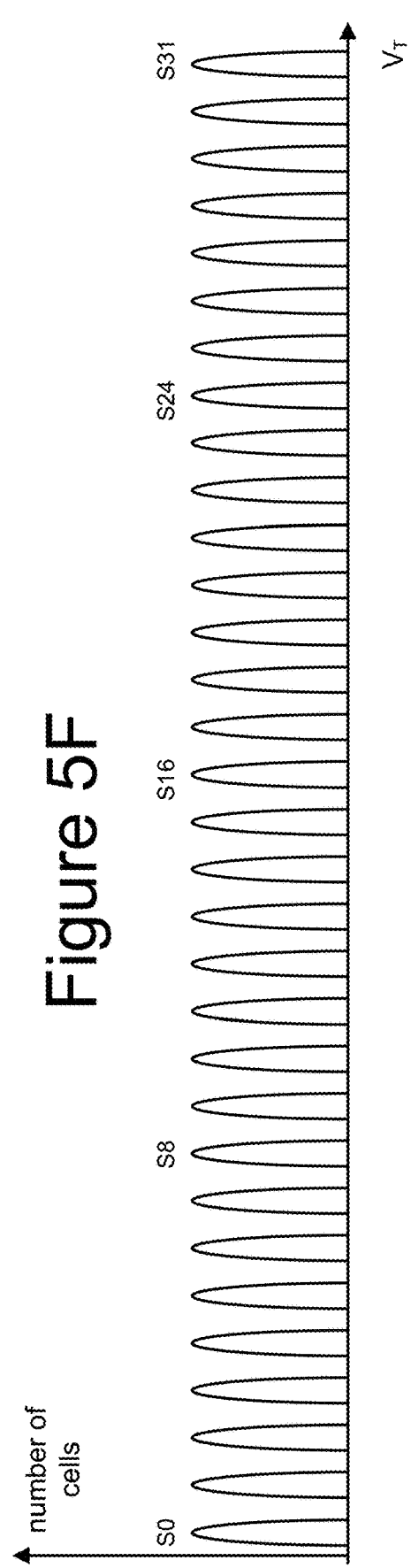
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
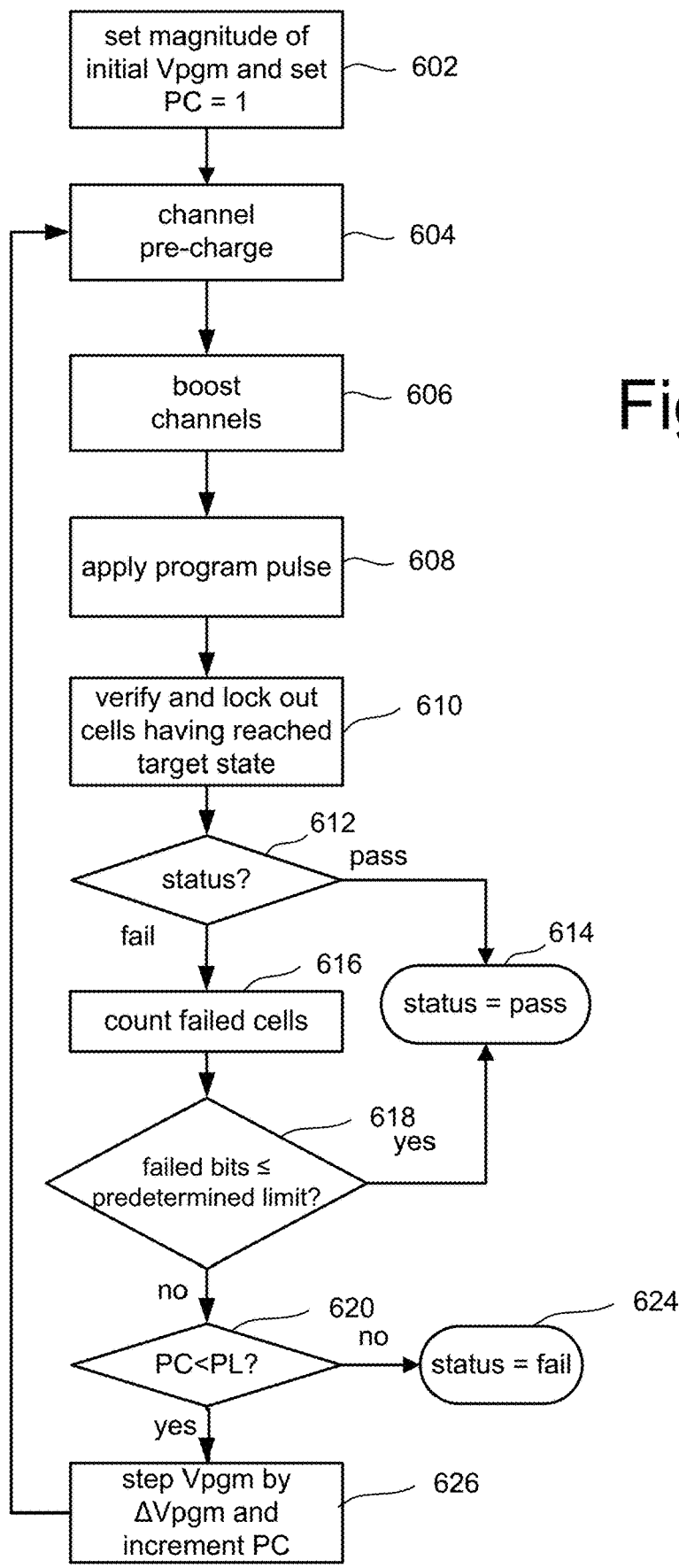
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
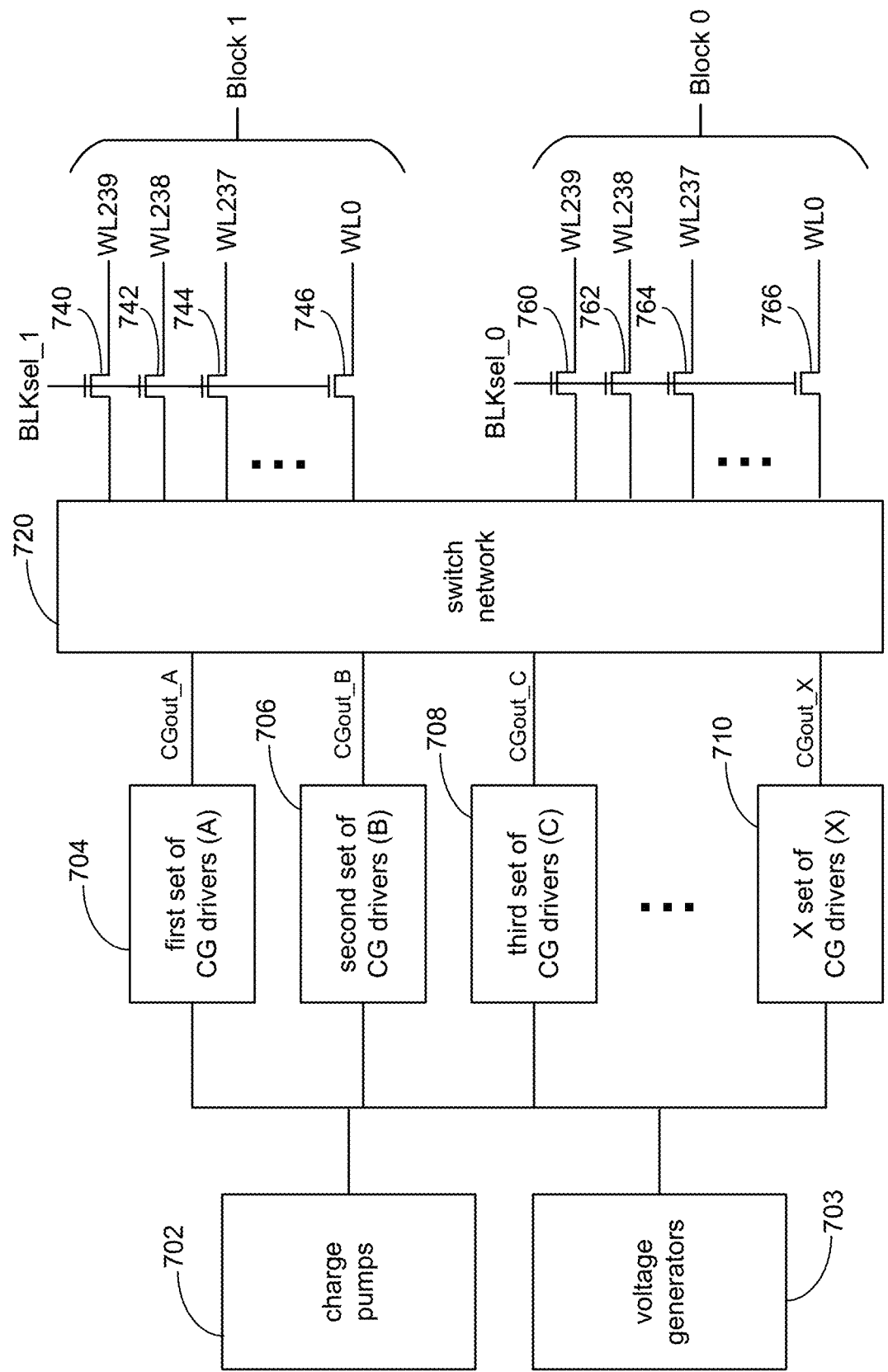
FIG. 7 is a block diagram that depicts charge pumps, control gate drivers, a switch network, word line switches, and word lines.

The programming, reading and erasing processes discussed above all require that various voltages be applied to the word lines of the selected block(s) of memory cells. FIG. 7 is a block diagram that depicts charge pumps, control gate drivers, a switch network, and word line switches that are used to apply those voltages to the word lines. FIG. 7 shows a set of charge pumps 702 and voltage generators 703 providing multiple different sources of voltages to multiple sets of control gate drivers including a first set of control gate drivers 704, a second set of control gate drivers 706, a third set of control gate drivers 708, . . . a X set of control gate drivers 710. Charge pumps 702 include multiple charge pumps that supply some of the different voltages needed to perform memory operations. Voltage generators 703 also generate some of the different voltages needed to perform memory operations. In one embodiment, there is a separate set of one or more charge pumps or voltage generator for each voltage needed to be applied to the word lines. In other embodiments, some charge pumps and. or voltage generators can be the source of multiple voltages by using voltage dividers or other circuits.

In one embodiment, first set of control gate drivers 704 includes multiple control gate drivers for supplying the necessary voltages to data word lines (e.g., W1-WL239) in order to perform programming, erasing and reading. The output of the first set of control gate drivers 704, CGout_A (which includes one separate output signal for each control gate driver), is provided (connected) to switch network 720. First set of control gate drivers 704 are connected to the data word lines via switch network 720. In one embodiment, all of the control gate drivers of the first set of control gate drivers 704 have the same structure, receive the same inputs (source of voltage) and provide the same set of voltage outputs.

In one embodiment, second set of control gate drivers 706 includes multiple control gate drivers for supplying the necessary voltages to dummy word lines (e.g., DD0, DD1, DS) in order to perform programming, erasing and reading. The output of the second set of control gate drivers 706, CGout_B (which includes one separate output signal for each control gate driver), is provided (connected) to switch network 720. The second set of control gate drivers 706 are connected to the dummy word lines via switch network 720. In one embodiment, all of the control gate drivers of the second set of control gate drivers 706 have the same structure, receive the same inputs (sources of voltage) and provide the same set of voltage outputs.

In one embodiment, third set of control gate drivers 708 includes multiple control gate drivers for supplying the necessary voltages to select lines (e.g., SGD and SGS) in order to perform programming, erasing and reading. The output of the first set of control gate drivers 708, CGout_C (which includes one separate output signal for each control gate driver), is provided (connected) to switch network 720. The third set of control gate drivers 708 are connected to the select lines via switch network 720. In one embodiment, all of the control gate drivers of the third set of control gate drivers 708 have the same structure, receive the same inputs (sources of voltage) and provide the same set of voltage outputs. Although FIG. 7 shows three sets of word line switches, other embodiments can include more or less than three sets.

FIG. 7 shows word lines WL0-WL239 for two example blocks (Block 0 and Block 1). Each word line WL0-WL239 for each block is connected to an output of switch network 720 via a word line switch transistor (e.g., 740-766). For example, word line WL0 of block 0 is connected to the output of word line switch transistor 766, WL237 of block 0 is connected to the output of word line switch transistor 764, WL238 of block 0 is connected to the output of word line switch transistor 762, WL239 of block 0 is connected to the output of word line switch transistor 760, WL0 of block 1 is connected to the output of word line switch transistor 746, WL237 of block 1 is connected to the output of word line switch transistor 744, WL238 of block 1 is connected to the output of word line switch transistor 742, and WL239 of block 1 is connected to the output of word line switch transistor 760. The inputs to the word line switches are connected to outputs of switch network 720. In one embodiment, switch network 720 includes a plurality of high voltage switches (e.g., transistors) to connect the control gate drivers to the appropriate word lines by routing the output voltage from the control gate drivers to the appropriate word line switch transistors 740-766 connected to the word lines WL0-WL239 of each block. Note that in some embodiments, multiple word lines can share a single control gate driver.

Figure 8:
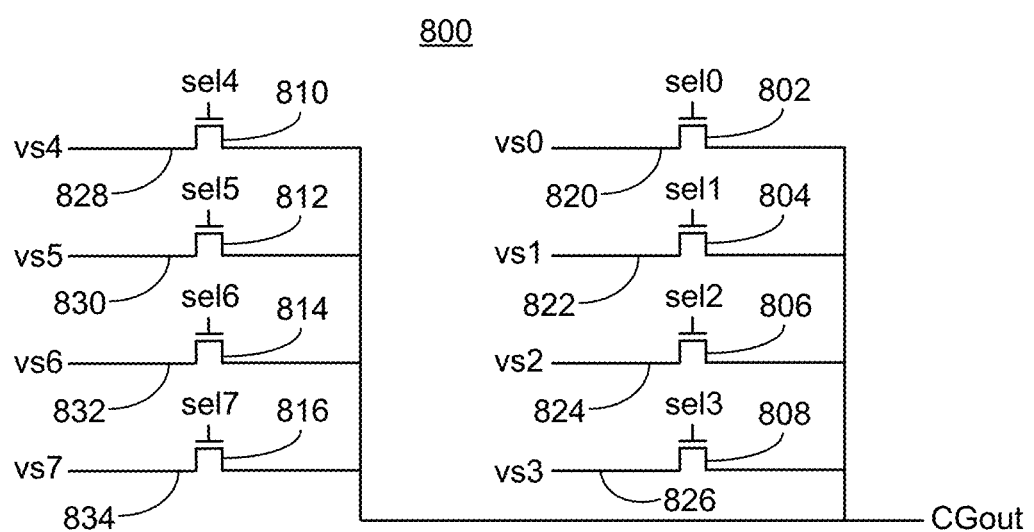
FIG. 8 is a schematic diagram of one example of a control gate driver.

In one embodiment, each control gate driver receives a set of sources of voltages (e.g., from charge pumps) as inputs and selectively outputs one of the input sources of voltage. In one example embodiment, each control gate driver includes a voltage path for each input source of voltage that routes the respective input source of voltage to the output for the control gate driver. Each voltage path includes an internal switch to select/deselect (turn on/off) the voltage path. In one example implementation, only one voltage path for each control gate driver is selected (turned on) at a time. FIG. 8 is a schematic diagram of one example of a control gate driver 800. Control gate driver 800 includes eight voltage paths 820, 822, 824, 826, 828, 830, 832 and 834. Voltage path 820 receives (is connected to) source of voltage vs0 (e.g., an output of a charge pump) and includes an internal switch 802 (e.g., a pass gate transistor) to asynchronously select voltage path 820 and provide Vs0 to CGout. Voltage path 822 receives (is connected to) source of voltage vs1 (e.g., an output of a charge pump) and includes an internal switch 804 (e.g., a pass gate transistor) to asynchronously select voltage path 822 and provide Vs1 to CGout. Voltage path 824 receives (is connected to) source of voltage vs2 (e.g., an output of a charge pump) and includes an internal switch 806 (e.g., a pass gate transistor) to asynchronously select voltage path 824 and provide Vs2 to CGout. Voltage path 826 receives (is connected to) source of voltage vs3 (e.g., an output of a charge pump) and includes an internal switch 808 (e.g., a pass gate transistor) to asynchronously select voltage path 826 and provide Vs3 to CGout. Voltage path 828 receives (is connected to) source of voltage vs4 (e.g., an output of a charge pump) and includes an internal switch 810 (e.g., a pass gate transistor) to asynchronously select voltage path 828 and provide Vs4 to CGout. Voltage path 830 receives (is connected to) source of voltage vs5 (e.g., an output of a charge pump) and includes an internal switch 812 (e.g., a pass gate transistor) to asynchronously select voltage path 830 and provide Vs5 to CGout. Voltage path 832 receives (is connected to) source of voltage vs6 (e.g., an output of a charge pump) and includes an internal switch 814 (e.g., a pass gate transistor) to asynchronously select voltage path 832 and provide Vs6 to CGout. Voltage path 834 receives (is connected to) source of voltage vs7 (e.g., an output of a charge pump) and includes an internal switch 816 (e.g., a pass gate transistor) to asynchronously select voltage path 834 and provide Vs7 to CGout. In one embodiment, each of vs0-vs7 are different voltage magnitudes. In one embodiment, only one of voltage paths 820-834 are selected at a time. Select signal se10 turns on/off internal switch 802. Select signal se11 turns on/off internal switch 804. Select signal se12 turns on/off internal switch 806. Select signal se13 turns on/off internal switch 808. Select signal se14 turns on/off internal switch 810. Select signal se15 turns on/off internal switch 812. Select signal se16 turns on/off internal switch 814. Select signal se17 turns on/off internal switch 816. In one embodiment, select signals se10-se17 are controlled by state machine 262 (or other circuit that is part of the control circuit).

FIG. 8 shows control gate driver 800 having eight voltages paths, 8 input sources of voltages and eight output voltages. In other embodiments, a control gate driver can have more than eight or less than eight voltages paths, input sources of voltages and output voltages. FIG. 8 provides an example structure of a control gate driver that can be used to implement a control gate driver of any of first set of control gate drivers 704, second set of control gate drivers 706, and third set of control gate drivers 708; however, the number of voltage paths and sources of voltage can vary. In one embodiment, all of the control gate drivers of first set of control gate drivers 704 include the same number of voltages paths, same input sources of voltages and same possible output voltages; all of the control gate drivers of second set of control gate drivers 706 include the same number of voltages paths, same input sources of voltages and same possible output voltages; and all of the control gate drivers of third set of control gate drivers 708 include the same number of voltages paths, same input sources of voltages and same possible output voltages. In some embodiments, the control gate drivers of the first set of control gate drivers 704 are different than the control gate drivers of the second set of control gate drivers 706 and the control gate drivers of the third set of control gate drivers 708. In some embodiments, the control gate drivers of the second set of control gate drivers 706 are different than the control gate drivers of the third set of control gate drivers 708.

If any of the internal switches 802-816 and/or voltage paths 820-834 of a control gate driver have or develop a defect, the control gate driver may fail to function properly. A malfunctioning control gate driver can lead to a die level or plane level failure for a memory die. Currently, memory die are tested at the factory to screen for defects. However, there is no direct test that checks the control gate drivers. Rather, the memory die is tested by performing program/read/erase cycles. The time needed for performing such tests is long and the tests do not always find defective control gate drivers. Additionally, sometimes a control gate driver may work properly at the time of manufacture and then fail in the field.

To prevent a die or plane level failure due to a defective control gate driver, it is proposed to utilize one or more redundant control gate drivers. For purposes of this document, the control gate drivers that are intended for normal operation of the memory when no defects are present in the control gate drivers (e.g., first set of control gate drivers 704, second set of control gate drivers 706 and third set of control gate drivers 708) are referred to as regular control gate drivers. In one embodiment, the regular control gate drivers of a non-volatile memory system typically include different subsets of control gate drivers (e.g., 704, 706, 708) that receive different sources of voltage, have different voltage paths and provide different output voltages. A redundant control gate driver that receives all of the different sources of voltage and provides all of the different output voltages can replace any of the regular control gate drivers.

Figure 9:
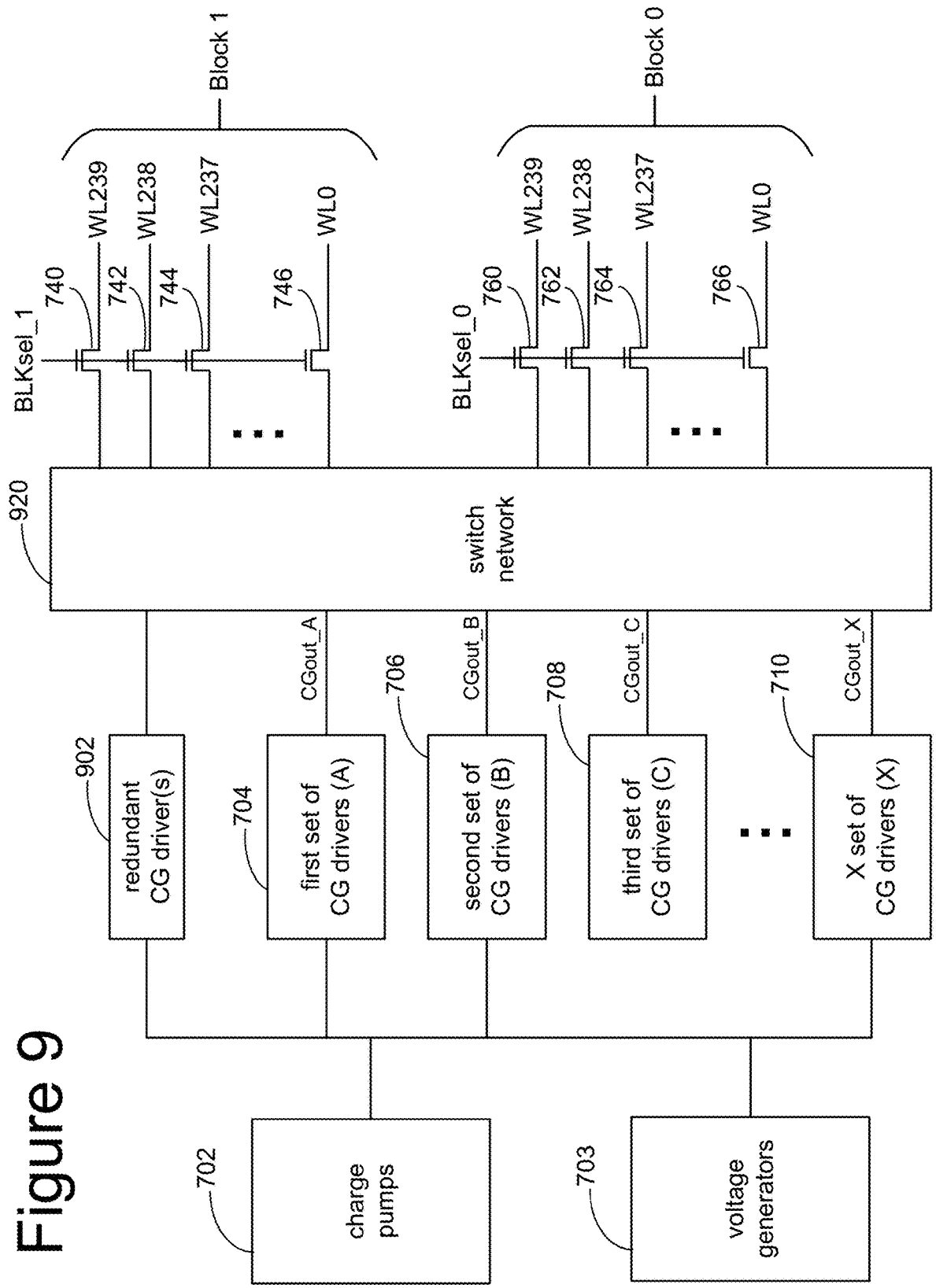
FIG. 9 is a block diagram that depicts charge pumps, control gate drivers, a switch network, word line switches, and word lines.

FIG. 9 is a block diagram that depicts the same charge pumps 702, voltage generators 703, regular control gate drivers 704/706/708/710, and word line switches 740-766 as FIG. 7. However, FIG. 9 also depicts redundant control gate drivers 902, which includes one or more redundant control gate drivers that can replace any of the regular control gate drivers 704/706/708. Each redundant control gate driver of redundant control gate drivers 902 is implemented using the general structure of FIG. 8, but includes all of the different sources of voltage and all of the different output voltages of the regular control gate drivers. Switch network 920 is similar to switch network 720, but includes extra switches so that each redundant control gate driver of redundant control gate drivers 902 can be routed to any of the word line switch transistors 740-766 to allow for connection to any of the word lines in order to selectively replace any of the regular control gate drivers of the first set of control gate drivers 704, second set of control gate drivers 706 and third set of control gate drivers 708. Switch network 920 can connect each of the regular control gate drivers to a subset of word lines and can connect the redundant control gate driver to any of the word lines (that is the redundant control gate driver is connectable to all word lines). That is, the redundant control gate driver is connected to all of the word lines and selectively in electrical communication with a selectable subset of the word lines.

Each regular control gate driver is capable of outputting a plurality of output voltages (see FIG. 8) such that a first subset 704 of the regular control gate drivers are configured to output a first plurality of output voltages, a second subset 706 of the set of regular control gate drivers are configured to output a second plurality of output voltages and a third subset 708 of the set of regular control gate drivers are configured to output a third plurality of output voltages; where the first plurality of output voltages includes one or more different voltages than the second plurality of output voltages, the first plurality of output voltages includes one or more different voltages than the third plurality of output voltages, and the second plurality of output voltages includes one or more different voltages than the third plurality of output voltages. Each redundant control gate driver is configured to output the first plurality of output voltages, the second plurality of output voltages, and/or the third plurality of output voltages. The system is configured to selectively replace any one of the regular control gate drivers with a redundant control gate driver.

Figure 10:
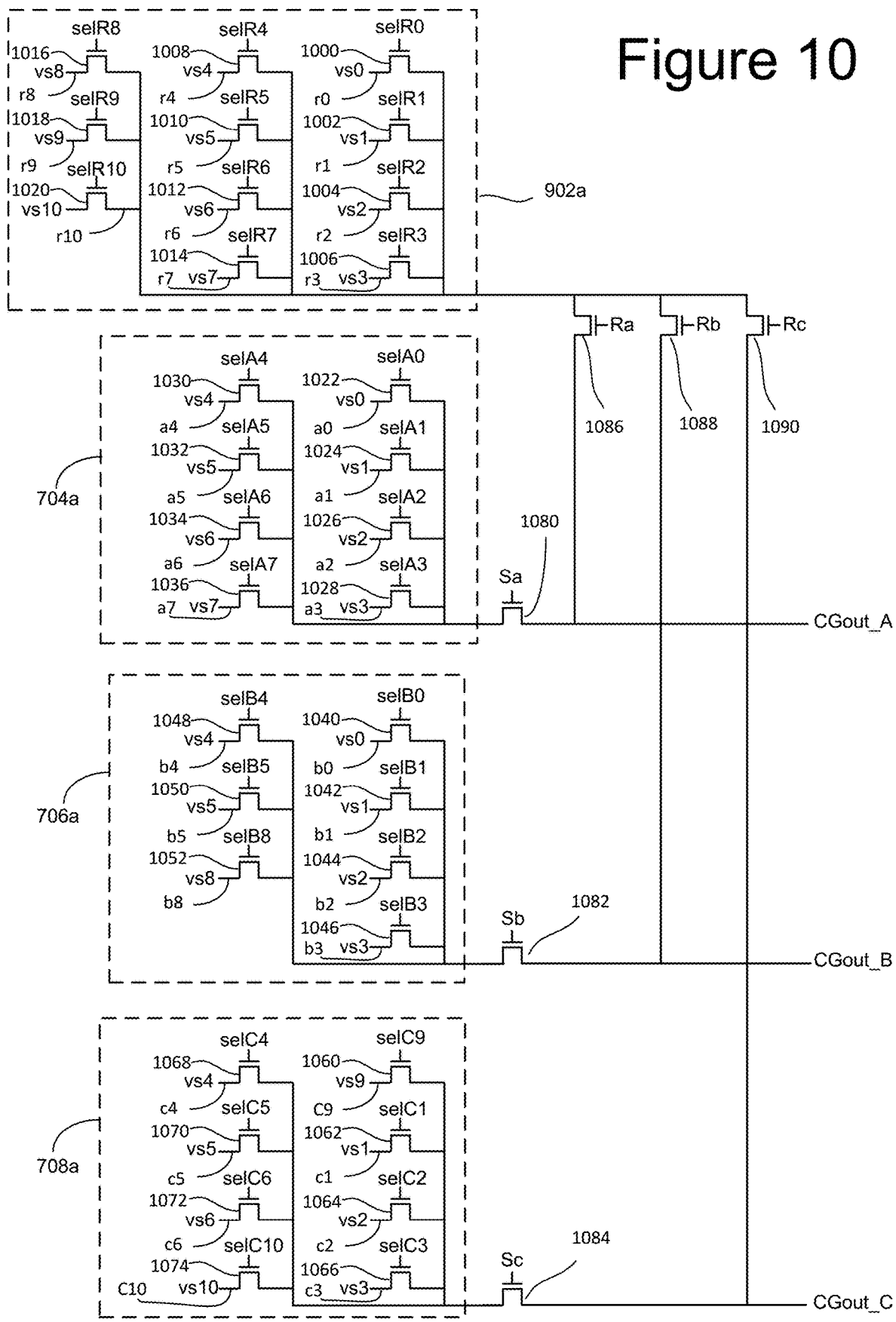
FIG. 10 is a schematic diagram of one embodiment of a redundant control gate driver and multiple regular control gate drivers.

FIG. 10 is a partial schematic diagram that depicts one embodiment of a portion of the components of FIG. 9. FIG. 10 shows one redundant control line driver 902a, one regular control gate driver 704a of the first set of control gate drivers 704, one regular control gate driver 706a of the second set of control gate drivers 706, and one regular control gate driver 708a of the third set of control gate drivers 708. Only one control gate driver of each set is depicted to keep the drawing easy to read; however, in an actual implementation the circuit would likely include more than one control gate driver of each set 704/706/708/710.

Redundant control gate driver 902a comprises eleven voltage paths r0, r1, r2, r3, r4, r5, r6, r7, r8, r9 and r10. Voltage path r0 receives (is connected to) source of voltage vs0 (e.g., an output of a charge pump) and includes an internal switch 1000 (e.g., a pass gate transistor) to asynchronously select voltage path r0 and provide Vs0 to the output of redundant control gate driver 902a. Select signal selR0 turns on/off internal switch 1000. Voltage path r1 receives (is connected to) source of voltage vs1 (e.g., an output of a charge pump) and includes an internal switch 1002 (e.g., a pass gate transistor) to asynchronously select voltage path r1 and provide Vs1 to the output of redundant control gate driver 902a. Select signal selR1 turns on/off internal switch 1002. Voltage path r2 receives (is connected to) source of voltage vs2 (e.g., an output of a charge pump) and includes an internal switch 1004 (e.g., a pass gate transistor) to asynchronously select voltage path r2 and provide Vs2 to the output of redundant control gate driver 902a. Select signal selR2 turns on/off internal switch 1004. Voltage path r3 receives (is connected to) source of voltage vs3 (e.g., an output of a charge pump) and includes an internal switch 1006 (e.g., a pass gate transistor) to asynchronously select voltage path r3 and provide Vs3 to the output of redundant control gate driver 902a. Select signal selR3 turns on/off internal switch 1006. Voltage path r4 receives (is connected to) source of voltage vs4 (e.g., an output of a charge pump) and includes an internal switch 1008 (e.g., a pass gate transistor) to asynchronously select voltage path r4 and provide Vs4 to the output of redundant control gate driver 902a. Select signal se1R4 turns on/off internal switch 1008. Voltage path r5 receives (is connected to) source of voltage vs5 (e.g., an output of a charge pump) and includes an internal switch 1010 (e.g., a pass gate transistor) to asynchronously select voltage path r5 and provide Vs5 to the output of redundant control gate driver 902a. Select signal se1R5 turns on/off internal switch 1010. Voltage path r6 receives (is connected to) source of voltage vs6 (e.g., an output of a charge pump) and includes an internal switch 1012 (e.g., a pass gate transistor) to asynchronously select voltage path r6 and provide Vs6 to the output of redundant control gate driver 902a. Select signal se1R6 turns on/off internal switch 1012. Voltage path r7 receives (is connected to) source of voltage vs7 (e.g., an output of a charge pump) and includes an internal switch 1014 (e.g., a pass gate transistor) to asynchronously select voltage path r7 and provide Vs7 to the output of redundant control gate driver 902a. Each of vs0-vs7 are different voltage magnitudes. Select signal se1R7 turns on/off internal switch 1014. Voltage path r8 receives (is connected to) source of voltage vs8 (e.g., an output of a charge pump) and includes an internal switch 1016 (e.g., a pass gate transistor) to asynchronously select voltage path r8 and provide Vs8 to the output of redundant control gate driver 902a. Select signal se1R8 turns on/off internal switch 1016. Voltage path r9 receives (is connected to) source of voltage vs9 (e.g., an output of a charge pump) and includes an internal switch 1018 (e.g., a pass gate transistor) to asynchronously select voltage path r9 and provide Vs9 to the output of redundant control gate driver 902a. Select signal se1R9 turns on/off internal switch 1018. Voltage path r10 receives (is connected to) source of voltage vs10 (e.g., an output of a charge pump) and includes an internal switch 1020 (e.g., a pass gate transistor) to asynchronously select voltage path r10 and provide Vs10 to the output of redundant control gate driver 902a. Each of vs0-vs10 are different voltage magnitudes. Select signal se1R10 turns on/off internal switch 1020. Select signals se1R0-se1R10 are controlled by state machine 262 (or other circuit of the control circuit). Redundant control gate driver 902a includes received eleven sources of voltage (vs0-vs10) and can output eleven output voltages (that correspond to the input sources of voltage).

Regular control gate driver 704a comprises eight voltage paths a0, a1, a2, a3, a4, a5, a6, and a7. Voltage path a0 receives (is connected to) source of voltage vs0 and includes an internal switch 1022 (e.g., a pass gate transistor) to asynchronously select voltage path a0 and provide Vs0 to the output of regular control gate driver 704a. Select signal se1A0 turns on/off internal switch 1022. Voltage path a1 receives (is connected to) source of voltage vs1 and includes an internal switch 1024 (e.g., a pass gate transistor) to asynchronously select voltage path a1 and provide Vs1 to the output of regular control gate driver 704a. Select signal se1A1 turns on/off internal switch 1024. Voltage path a2 receives (is connected to) source of voltage vs2 and includes an internal switch 1026 (e.g., a pass gate transistor) to asynchronously select voltage path a2 and provide Vs2 to the output of regular control gate driver 704a. Select signal se1A2 turns on/off internal switch 1026. Voltage path a3 receives (is connected to) source of voltage vs3 and includes an internal switch 1028 (e.g., a pass gate transistor) to asynchronously select voltage path a3 and provide Vs3 to the output of regular control gate driver 704a. Select signal se1A3 turns on/off internal switch 1028. Voltage path a4 receives (is connected to) source of voltage vs4 and includes an internal switch 1030 (e.g., a pass gate transistor) to asynchronously select voltage path a4 and provide Vs4 to the output of regular control gate driver 704a. Select signal se1A4 turns on/off internal switch 1030. Voltage path a5 receives (is connected to) source of voltage vs5 and includes an internal switch 1032 (e.g., a pass gate transistor) to asynchronously select voltage path a5 and provide Vs5 to the output of regular control gate driver 704a. Select signal se1A5 turns on/off internal switch 1032. Voltage path a6 receives (is connected to) source of voltage vs6 and includes an internal switch 1034 (e.g., a pass gate transistor) to asynchronously select voltage path a6 and provide Vs6 to the output of regular control gate driver 704a. Select signal se1A6 turns on/off internal switch 1034. Voltage path a7 receives (is connected to) source of voltage vs7 and includes an internal switch 1036 (e.g., a pass gate transistor) to asynchronously select voltage path a7 and provide Vs7 to the output of regular control gate driver 704a. Select signal se1A7 turns on/off internal switch 1036. Each of vs0-vs7 are different voltage magnitudes. Select signal se1A7 turns on/off internal switch 1014. Select signals se1A0-se1A7 are controlled by state machine 262 (or other circuit of the control circuit).

Regular control gate driver 706a comprises seven voltage paths b0, b1, b2, b3, b4, b5, and b8. Voltage path b0 receives (is connected to) source of voltage vs0 and includes an internal switch 1040 (e.g., a pass gate transistor) to asynchronously select voltage path b0 and provide Vs0 to the output of regular control gate driver 706a. Select signal se1B0 turns on/off internal switch 1040. Voltage path b1 receives (is connected to) source of voltage vs1 and includes an internal switch 1042 (e.g., a pass gate transistor) to asynchronously select voltage path b1 and provide Vs1 to the output of regular control gate driver 706a. Select signal se1B1 turns on/off internal switch 1042. Voltage path b2 receives (is connected to) source of voltage vs2 and includes an internal switch 1044 (e.g., a pass gate transistor) to asynchronously select voltage path b2 and provide Vs2 to the output of regular control gate driver 706a. Select signal se1B2 turns on/off internal switch 1044. Voltage path b3 receives (is connected to) source of voltage vs3 and includes an internal switch 1046 (e.g., a pass gate transistor) to asynchronously select voltage path b3 and provide Vs3 to the output of regular control gate driver 706a. Select signal se1B3 turns on/off internal switch 1046. Voltage path b4 receives (is connected to) source of voltage vs4 and includes an internal switch 1048 (e.g., a pass gate transistor) to asynchronously select voltage path b4 and provide Vs4 to the output of regular control gate driver 706a. Select signal se1B4 turns on/off internal switch 1048. Voltage path b5 receives (is connected to) source of voltage vs5 and includes an internal switch 1050 (e.g., a pass gate transistor) to asynchronously select voltage path b5 and provide Vs5 to the output of regular control gate driver 706a. Select signal se1B5 turns on/off internal switch 1050. Voltage path b8 receives (is connected to) source of voltage vs8 and includes an internal switch 1052 (e.g., a pass gate transistor) to asynchronously select voltage path b8 and provide Vs8 to the output of regular control gate driver 706a. Select signal se1B8 turns on/off internal switch 1052. Select signals se1B0-se1B8 are controlled by state machine 262 (or other circuit of the control circuit).

Regular control gate driver 708a comprises eight voltage paths c9, c1, c2, c3, c4, c5, c6, and c10. Voltage path c9 receives (is connected to) source of voltage vs9 and includes an internal switch 1060 (e.g., a pass gate transistor) to asynchronously select voltage path c9 and provide Vs0 to the output of regular control gate driver 708a. Select signal selC9 turns on/off internal switch 1060. Voltage path c1 receives (is connected to) source of voltage vs1 and includes an internal switch 1062 (e.g., a pass gate transistor) to asynchronously select voltage path c1 and provide Vs1 to the output of regular control gate driver 708a. Select signal selC1 turns on/off internal switch 1062. Voltage path c2 receives (is connected to) source of voltage vs2 and includes an internal switch 1064 (e.g., a pass gate transistor) to asynchronously select voltage path c2 and provide Vs2 to the output of regular control gate driver 708a. Select signal selC2 turns on/off internal switch 1064. Voltage path c3 receives (is connected to) source of voltage vs3 and includes an internal switch 1066 (e.g., a pass gate transistor) to asynchronously select voltage path c3 and provide Vs3 to the output of regular control gate driver 708a. Select signal selC3 turns on/off internal switch 1066. Voltage path c4 receives (is connected to) source of voltage vs4 and includes an internal switch 1068 (e.g., a pass gate transistor) to asynchronously select voltage path c4 and provide Vs4 to the output of regular control gate driver 708a. Select signal selC4 turns on/off internal switch 1068. Voltage path c5 receives (is connected to) source of voltage vs5 and includes an internal switch 1070 (e.g., a pass gate transistor) to asynchronously select voltage path c5 and provide Vs5 to the output of regular control gate driver 708a. Select signal selC5 turns on/off internal switch 1070. Voltage path c6 receives (is connected to) source of voltage vs6 and includes an internal switch 1072 (e.g., a pass gate transistor) to asynchronously select voltage path c6 and provide Vs6 to the output of regular control gate driver 708a. Select signal selC6 turns on/off internal switch 1072. Voltage path c10 receives (is connected to) source of voltage vs10 and includes an internal switch 1074 (e.g., a pass gate transistor) to asynchronously select voltage path c10 and provide Vs10 to the output of regular control gate driver 708a. Select signal selC10 turns on/off internal switch 1074. Select signals selC1-selC6, selC9 and selC10 are controlled by state machine 262 (or other circuit of the control circuit). FIG. 10 does not show charge pumps 702, all of switch network 920, word line switches 740-766 or the word lines. In one embodiment, the select signals are controlled by the state machine.

The circuit of FIG. 10 includes a plurality of switches comprising a plurality of output select switches (1080, 1082, and 1084) and a plurality of replacement switches (1086, 1088 and 1090). The plurality of output select switches include one output select switch at an output of each regular control gate driver. For example, output select switch 1080 (controlled by select signal Sa) is connected to and is at the output of regular control gate driver 704a, output select switch 1082 (controlled by select signal Sb) is connected to and is at the output of regular control gate driver 706a, and output select switch 1084 (controlled by select signal Sc) is connected to and is at the output of regular control gate driver 708a. The plurality of replacement switches are connected to and positioned at the output of redundant control gate driver 902a and include one replacement switch connected to an output of each of the output select switches. For example, replacement switches 1086/1088/1090 are connected to the output of redundant control gate driver 902a, replacement switch 1086 is also connected to the output of output select switch 1080, replacement switch 1088 is also connected to the output of output select switch 1082, and replacement switch 1090 is also connected to the output of output select switch 1084.

The control circuit (e.g., state machine) is configured to replace a particular regular control gate driver with the redundant control gate driver by turning off an output select switch at an output of the particular regular control gate driver and turning on a replacement switch at the output of the output select switch that is at the output of the particular regular control gate driver. For example, redundant control gate driver 902a can replace regular control gate driver 704a by: (1) asserting the appropriate select signal of se1R0-se1R10 to turn on the appropriate one of internal switches 1000-1020, (2) turning off output select switch 1080, and (3) turning on replacement switch 1086. Redundant control gate driver 902a can replace regular control gate driver 706a by: (1) asserting the appropriate select signal of se1R0-se1R10 to turn on the appropriate one of internal switches 1000-1020, (2) turning off output select switch 1082, and (3) turning on replacement switch 1088. Redundant control gate driver 902a can replace regular control gate driver 708a by: (1) asserting the appropriate select signal of se1R0-se1R10 to turn on the appropriate one of internal switches 1000-1020, (2) turning off output select switch 1084, and (3) turning on replacement switch 1090. Thus, the control circuit can selectively connect the redundant control gate driver to the output for a particular regular control gate driver (e.g., using Ra, Rb and Rc) and disconnect that particular regular control gate driver from the output for the particular regular control gate driver (e.g., using Sa, Sb and Sc).

In the example of FIG. 10, the redundant control gate driver 902a receives eleven sources of voltage (vs0-vs10) and can output any of those eleven voltages. Regular control gate driver 704a receives eight of the ten sources of and can output eight of the voltages that redundant control gate driver 902a can output. Regular control gate driver 706a receives seven of the ten sources of voltage and can output seven of the voltages that redundant control gate driver 902a can output. Regular control gate driver 708a receives eight of the ten sources of voltage (a different set of eight than regular control gate driver 704a) and can output eight of the voltages that redundant control gate driver 902a can output. Thus, each of the control gate drivers (902a, 704a, 706a, 708a) depicted in FIG. 10 receive/output different sets of voltages. The sets of voltages do have some overlap but are not exactly the same. For example, redundant control gate driver 902a receives/outputs vs8, vs9 and vs10, but regular control gate driver 704a does not; redundant control gate driver 902a receives/outputs vs6, vs7, vs9 and vs10, but regular control gate driver 706a does not; and redundant control gate driver 902a receives/outputs vs0, vs7, vs8 and vs10, but regular control gate driver 708a does not. So the different control gate drivers have different sources of voltages and different output voltages because there is at least one voltage that is not in common.

Figure 11:
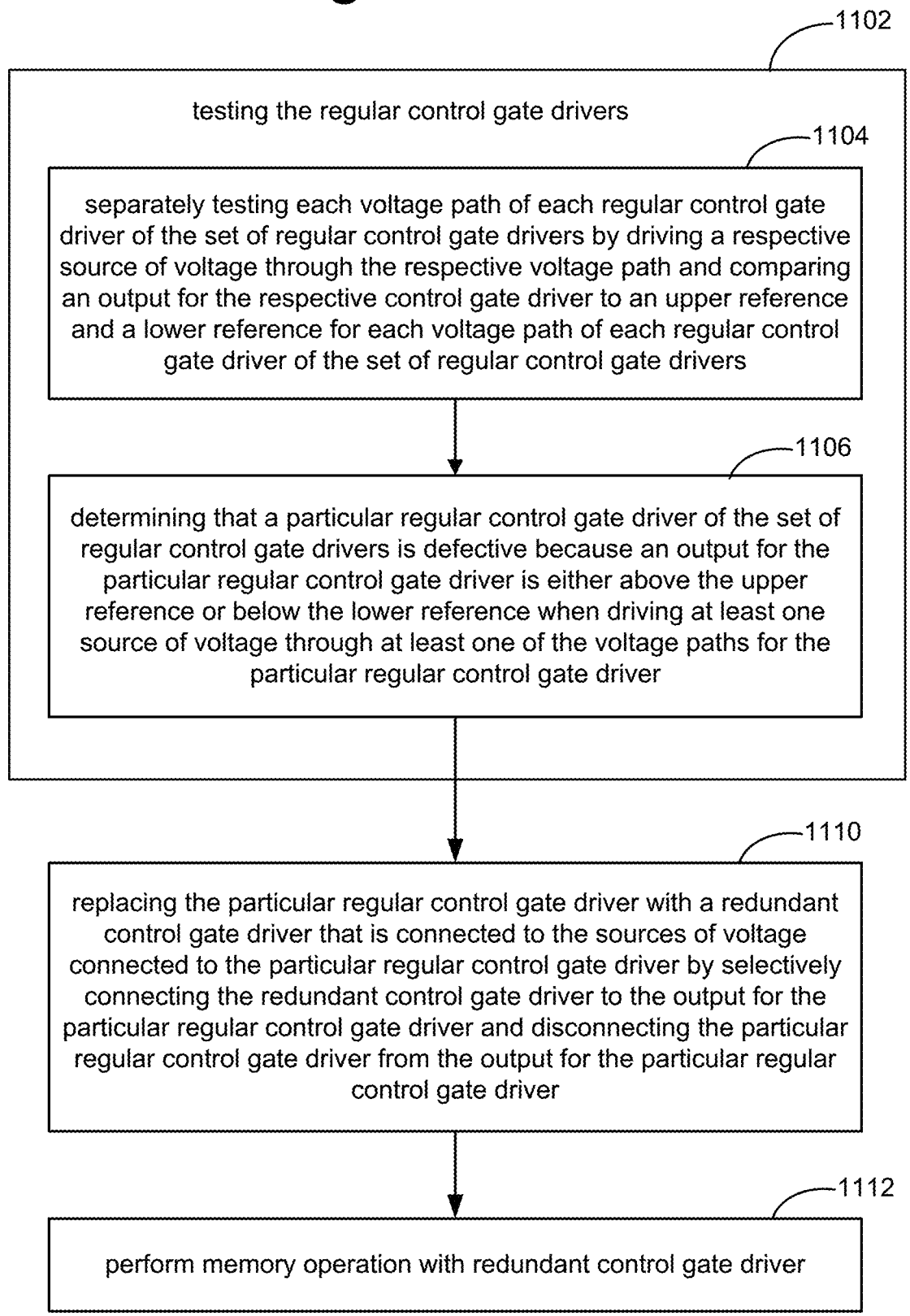
FIG. 11 is a flow chart describing one embodiment of a process for testing for and detecting a defective regular control gate driver, and selectively replacing the defective regular control gate driver.

FIG. 11 is a flow chart describing one embodiment of a process for testing for and detecting a defective regular control gate driver, and selectively replacing the defective regular control gate driver. In one example embodiment, the process of FIG. 11 is performed by any of the embodiments of a control circuit discussed above. In one example embodiment, the process of FIG. 11 is performed by integrated memory assembly 207 using any of the embodiments of a control circuit discussed above of control die 211 to perform a memory operation (e.g., program, erase, read, etc.) on memory cells (e.g., NAND strings of memory structure 202) on memory die 201. In one embodiment, the process of FIG. 11 is performed at the direction of state machine 262 (or another processor). The control circuit is connected to the memory cells (e.g., via control lines such as word lines, bit lines, source line and select lines), as described above.

In step 1102 of FIG. 11, the control circuit tests the regular control gate drivers to see if they are defective. In one embodiment, each regular control gate driver receives multiple different sources of voltage and comprises multiple voltage paths including a different voltage path connected to each of the received multiple different sources of voltage. The testing is performed in response to a command from a memory controller, a command from a host or as part of a maintenance operation.

In one embodiment, the testing of step 1102 includes separately testing each voltage path of each regular control gate driver of the set of regular control gate drivers by driving a respective source of voltage through the respective voltage path and comparing an output for the respective control gate driver to an upper reference and a lower reference for each voltage path of each regular control gate driver of the set of regular control gate drivers (step 1104). The testing of step 1102 also includes determining that a particular regular control gate driver of the set of regular control gate drivers is defective because an output for the particular regular control gate driver is either above the upper reference or below the lower reference when driving at least one source of voltage through at least one of the voltage paths for the particular regular control gate driver (step 1106).

After the testing of step 1102, the control circuit replaces the particular regular control gate driver that was found to be defective with the redundant control gate driver that is connected to the sources of voltage connected to the particular regular control gate driver by selectively connecting the redundant control gate driver to the output for the particular regular control gate driver and disconnecting the particular regular control gate driver from the output for the particular regular control gate driver in step 1110. The plurality of switches (see e.g., switches 180-190 of FIG. 10) are configured to selectively replace any one of the regular control gate drivers of the set of regular control gate drivers with the redundant control gate driver. For example, if the testing of step 1102 determined that regular control gate driver 706a is defective because the voltage output from voltage path b2, when driving source of voltage vs2 through voltage path b2, was below the lower reference, then step 1110 includes the control circuit using signal Sb to turn off output select switch 1082 and using signal Rb to turn on replacement switch 1088 so that redundant control gate driver 902a replaces regular control gate driver 706a.

In step 1112, the control circuit performs a memory operation (e.g., programming, erasing, writing), including using redundant control gate driver 902a to drive the appropriate word line voltages on the word lines that were supposed to be driven by regular control gate driver that was found to be defective.

Figure 12:
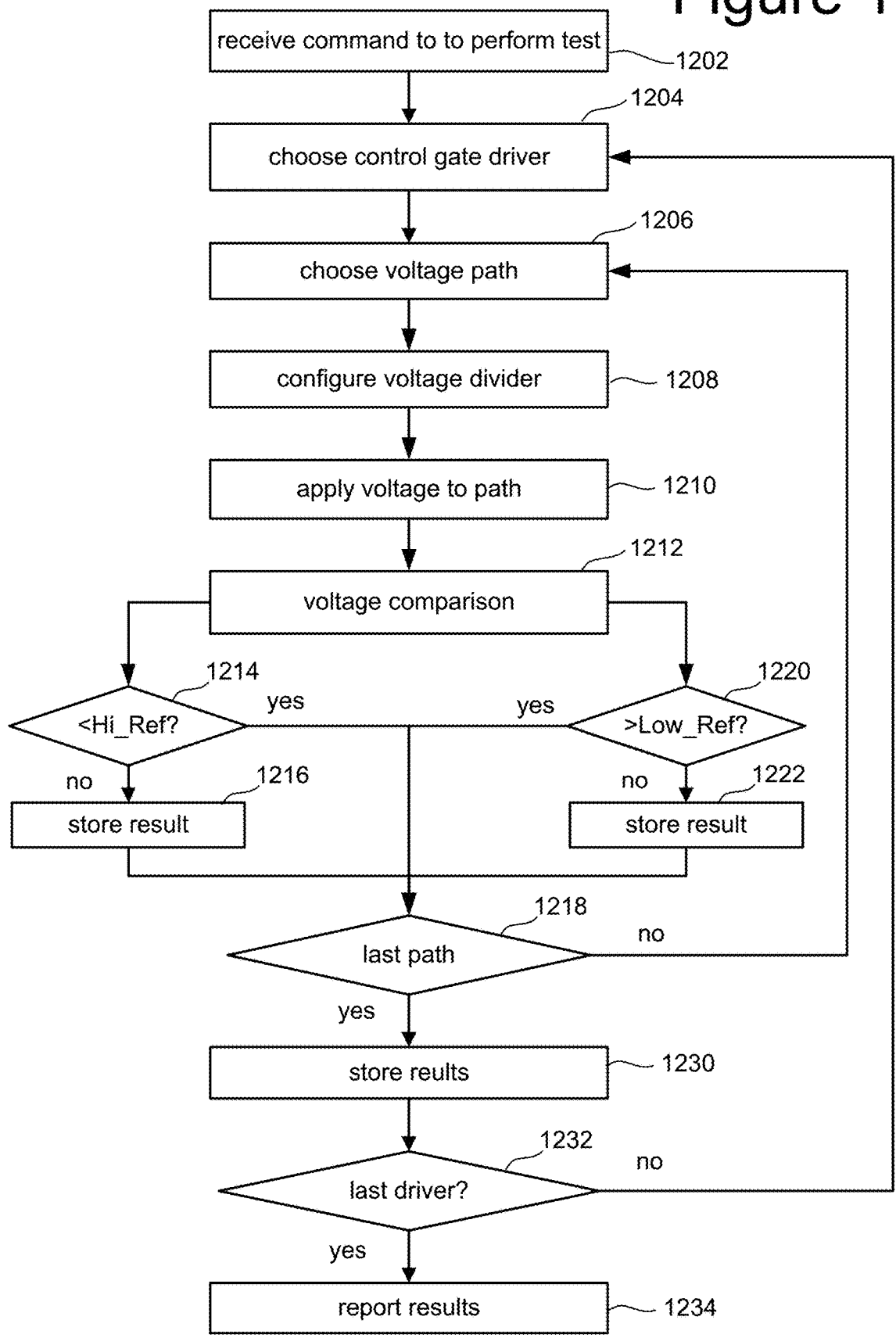
FIG. 12 is a flow chart describing one embodiment of a process for testing for a defective regular control gate driver.

FIG. 12 is a flow chart describing one embodiment of a process for testing for a defective regular control gate driver. The process of FIG. 12 is an example implementation of step 1102 of FIG. 11. In one example embodiment, the process of FIG. 12 is performed by any of the embodiments of a control circuit discussed above. In one example embodiment, the process of FIG. 12 is performed by integrated memory assembly 207 using control die 211. In one embodiment, the process of FIG. 12 is performed at the direction of state machine 262 (or another processor).

In step 1202 of FIG. 12, the control circuit receives a command to perform the test of the regular control gate drivers. The command can be received from the memory controller, the host or another entity. In step 1204, the control circuit chooses a regular control gate driver that needs to be tested. In step 1206, the control circuit chooses voltage path to be tested for the current regular control gate driver that is selected.

Figure 13:
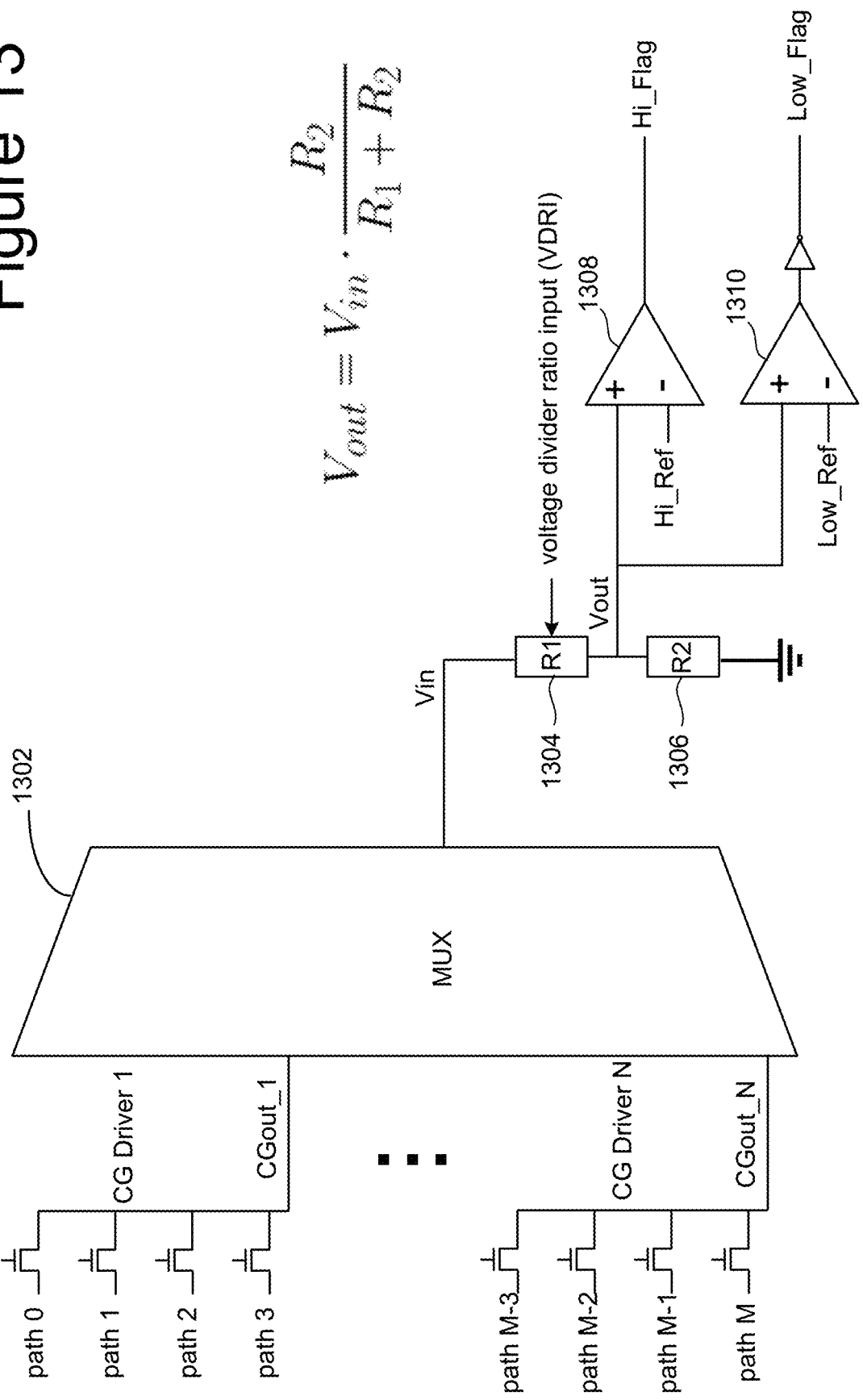
FIG. 13 is a schematic diagram of a circuit that tests for a defective regular control gate driver.

In one embodiment, the same test circuit is used for testing every voltage path (e.g., a0, a1, . . . , b0, b1, . . . , c1, c2, . . . ) even though the different voltage paths transmit different voltages. To account for the different voltages (e.g., vs0, vs1, . . . vs10), a configurable voltage divider is used to adjust the voltage provided by the voltage path under test to be within the predetermined range of the test circuit. Therefore, in step 1208 the voltage divider is configured for the voltage path currently selected to be tested. FIG. 13 is a schematic diagram of the test circuit that tests for a defective regular control gate driver. In one embodiment, the test circuit includes a multiplexer circuit 1302 that receives all of the voltage paths (path 0, path 1, path 2, . . . path m) and selects one for output. Step 1206 of FIG. 12 includes applying the appropriate select signal from the state machine (or other control circuit) to the multiplexer circuit 1302 to select the appropriate voltage path (e.g., path 0, path 1, path 2, . . . path m) of the appropriate control gate driver (e.g., CG Driver 1, . . . CG Driver N) for outputting from multiplexer circuit 1302. Also, in step 1206, the state machine (or other control circuit) turns on the appropriate internal switch (e.g., 1022, 1024, etc.) for the selected voltage path.

FIG. 13 depicts a variable and configurable voltage divider comprising RDAC 1304 (R1) and RDAC 1306 (R2). The output of the multiplexer circuit 1302 serves as the input voltage Vin to the voltage divider. The output of the voltage divider Vout is calculated as:

$$V_{out} = V_{in} \times \frac{R2}{R1 + R2}$$

The voltage divider ratio input (VDRI), provided by state machine 262, is used to configure the value of R1 in order to adjust Vout in step 1208. The output of the voltage divider is provided to comparator 1308 to be compared against an upper reference voltage Hi_Ref and provided to comparator 1310 to be compared against a lower reference voltage Low_Ref. If Vout is below Hi_Ref then the output of comparator 1308, Hi_Flag, is logic 0. If Vout is above Hi_Ref then the output of comparator 1308, Hi_Flag, is logic 1. If Vout is above Low_Ref then the output of comparator 1310, Low_Flag, is logic 0. If Vout is below Low_Ref then the output of comparator 1310, Low_Flag, is logic 1.

In step 1210 of FIG. 12, the appropriate source of voltage for the selected voltage path is applied to that selected voltage path with the appropriate internal switch (e.g., 1022, 1024, etc.) turned on to allow the applied source of voltage to flow through the selected voltage path and through multiplexer circuit 1302. In step 1212 of FIG. 12, comparators 1308 and 1310 compare the voltage provided by the selected voltage path (after passing through the voltage divider) to Hi_Ref and Low_Ref. If the voltage provided by the selected voltage path (after passing through the voltage divider) is not lower than Hi_Ref (step 1214), then the result (a fault) is stored in step 1216 and the process continues at step 1218. If the voltage provided by the selected voltage path (after passing through the voltage divider) is not higher than Low_Ref (step 1220), then the result (a fault) is stored in step 1222 and the process continues at step 1218. If the voltage provided by the selected voltage path (after passing through the voltage divider) is lower than Hi_Ref (step 1214) and higher than Low_Ref (step 1220), then the voltage path under test passed the test and the process continues at step 1218.

In step 1218, it is determined whether there are more not-yet-tested voltage paths of the current regular control gate driver under test (e.g., was the last voltage path just tested). If there are voltage paths of the current regular control gate driver under test that have not yet been tested, then the process loops back to step 1206 to test the next path. If all voltage paths of the regular current regular control gate driver under test have been tested, then the process continues at step 1230 to store the results of the testing for the current regular control gate driver under test. In step 1232, it is determined whether there are more regular control gate drivers that need to be tested (e.g., was the last control gate driver tested?). If there are more regular control gate drivers that need to be tested, then the process continues at step 1204 to test the next regular control gate driver. If all regular control gate drivers have been tested, then the testing is complete and the results are reported in step 1234 (e.g., reported to the memory controller and/or host).

Figure 14:
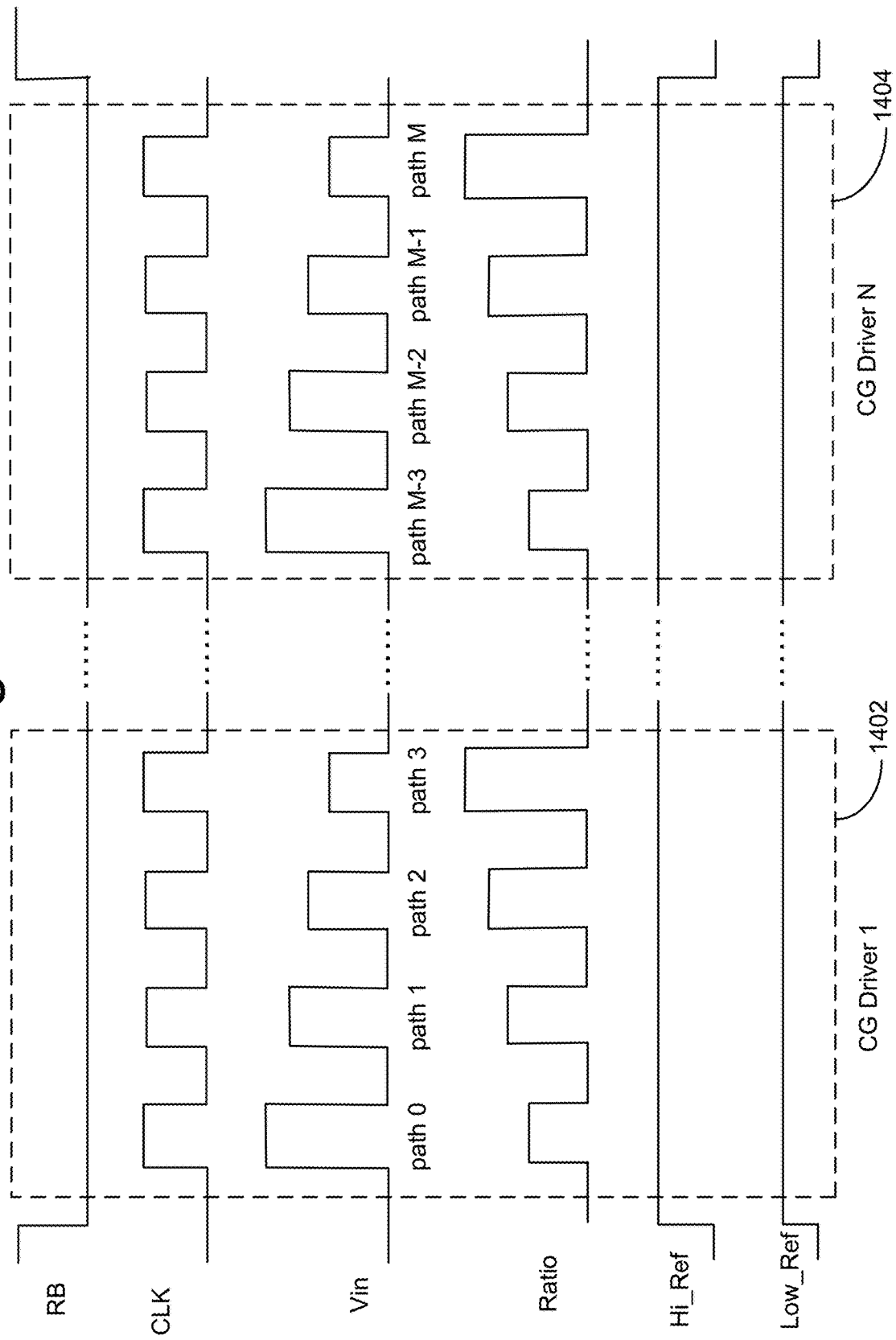
FIG. 14 is a timing diagram of various signals when testing for a defective regular control gate driver.

FIG. 14 is a timing diagram that explains the behavior of the circuit of FIG. 13 during the process of FIG. 12. FIG. 14 depicts the following signals: RB, CLK, Vin, Ratio, Hi_Ref and Low_ref. The signal RB is the ready/busy signal for the memory die. The memory die is available to receive and start a new command when RB=1 and busy performing a command when RB-=0. FIG. 14 shows that after the command to perform the test is received in step 1202, RB is lowered to ground (RB=0). The signal CLK is the clock for the memory die. The signal Vin is the output of multiplexer circuit 1302 and the input to the voltage divider of FIG. 13. The Ratio is the divide ratio for the voltage divider and in one embodiment:

$$\text{Ratio} = \frac{R2}{R1 + R2}$$

The signal Hi_Ref is the upper reference used in steps 1212 & 1214, and is an input to comparator 1308. The signal Low_Ref is the lower reference used in steps 1212 & 1220, and is an input to comparator 1310.

Each clock (CLK) pulse depicted in FIG. 14 corresponds to one iteration (ie one loop) of performing steps 1206-1218 (e.g., testing one voltage path). The dashed box 1402 indicates the clock pulses for testing the paths of CG Driver 1 (see FIG. 13). The dashed box 1404 indicates the clock pulses for testing the paths of CG Driver N (see FIG. 13). In one embodiment, at each iteration of steps 1206-1218 the Ratio will be changed (e.g., by the state machine or other circuit changing VDRI in order to change R1) to adjust for the different source of voltage applied to the voltage path under test. FIG. 14 shows that the voltages output by the voltage paths through multiplexer circuit 1302 decreases (see Vin) for each path and thus requiring the Ratio to be correspondingly increased. However, in other embodiments, the voltages output by the voltage paths could change in different ways than depicted in FIG. 14, thereby requiring different changes in the Ratio.

Steps 1216, 1222 and 1230 of FIG. 12 comprise storing the results of the testing. In one embodiment, the results are saved in a table (or other data structure) that can be stored in the non-volatile memory 202, volatile memory on the control die, registers on the control die, volatile memory 140 for memory controller 120, or at another storage location in the storage system 100. The control circuit uses a table (or other data structure) to perform step 1110 of FIG. 11, including replacing a defective regular control gate driver with a redundant control gate driver. That is, the control circuit uses the table (or other data structure) to identify which (if any) regular control gate drivers are defective. In one embodiment, the table includes an entry for every voltage path of every regular control gate drivers that indicates whether the voltage path is functional or defective. In some embodiments, the table includes an entry for every regular control gate drivers that indicates whether the regular control gate driver is functional or defective. In some embodiments, the table (or other data structure) includes an entry for every voltage path and for every regular control gate driver.

FIG. 15 depicts one embodiment of an example data structure that is written to in steps 1216, 1222 and 1230 of FIG. 12. The example data structure of FIG. 15 separately indicates whether each voltage path of each regular control gate driver is defective and whether each regular control gate driver is defective. The control circuit is configured to operate the redundant control gate driver and the plurality of switches (e.g., 1080-1090) to selectively replace any one of the regular control gate drivers with the redundant control gate driver based on the data structure (e.g., as per the process of FIGS. 11 & 12). For example, if path M-2 of regular control gate driver CG Driver N is indicated in the data structure of FIG. 15 to be defective, then the control circuit will use a redundant control gate driver to replace CG Driver N. In another example, if path b5 of regular control gate driver 706a is indicated in the data structure of FIG. 15 to be defective, then the control circuit will use redundant control gate driver 902a to replace regular control gate driver 706a by turning on replacement switch 1088 and turning off output select switch 1082.

Figure 16:
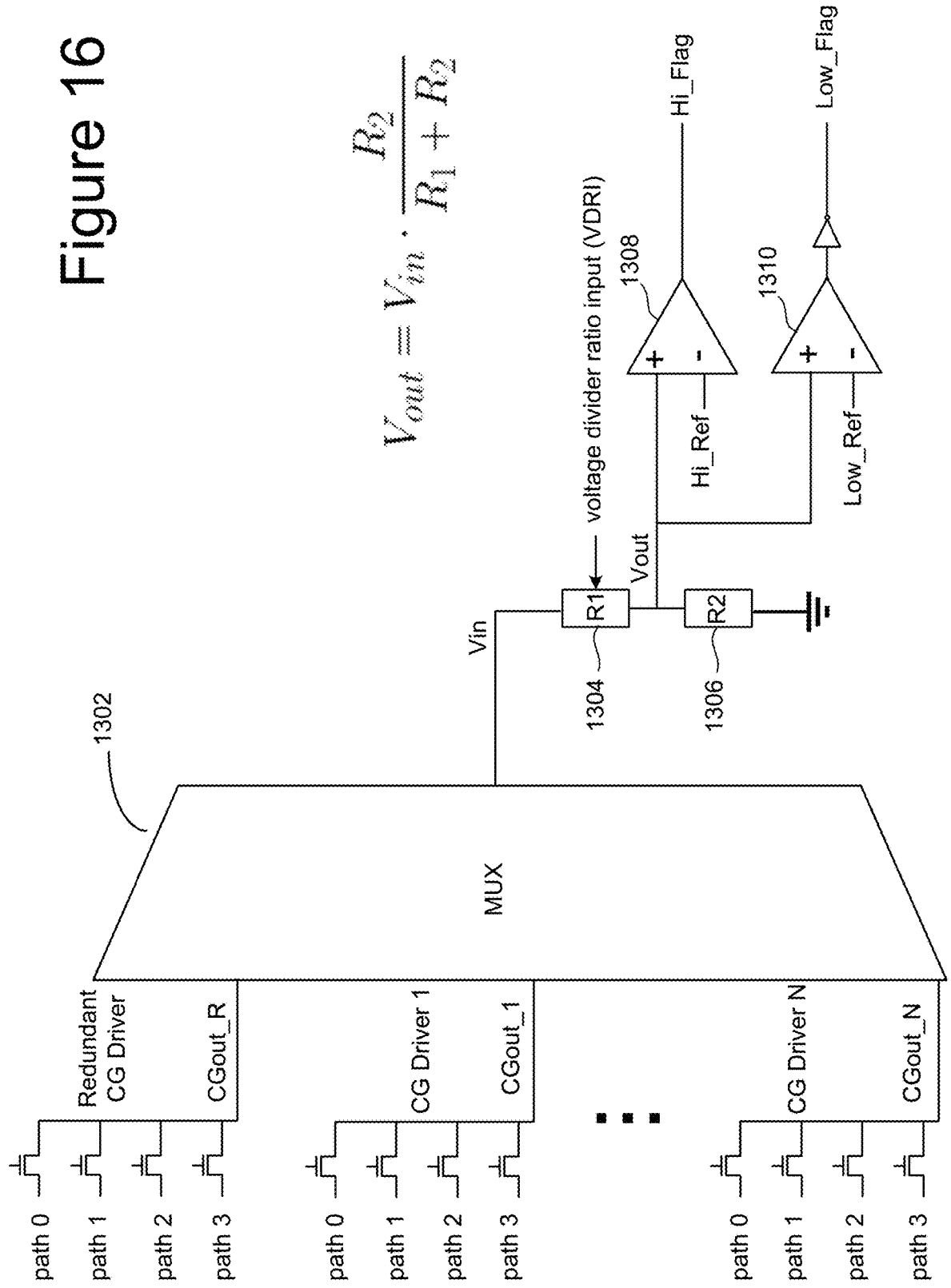
FIG. 16 is a schematic diagram of a circuit that tests for a defective regular control gate driver.

FIG. 16 is a schematic diagram of the test circuit that tests for a defective regular control gate driver. The circuit of FIG. 16 is similar to the circuit of FIG. 13 except that a version of the Redundant control gate (CG) driver is depicted as an input to multiplexer 1302 and (2) each of the control gate drivers include voltage path 0, voltage path 1, voltage path 2 and voltage path 3.

Figure 17A:
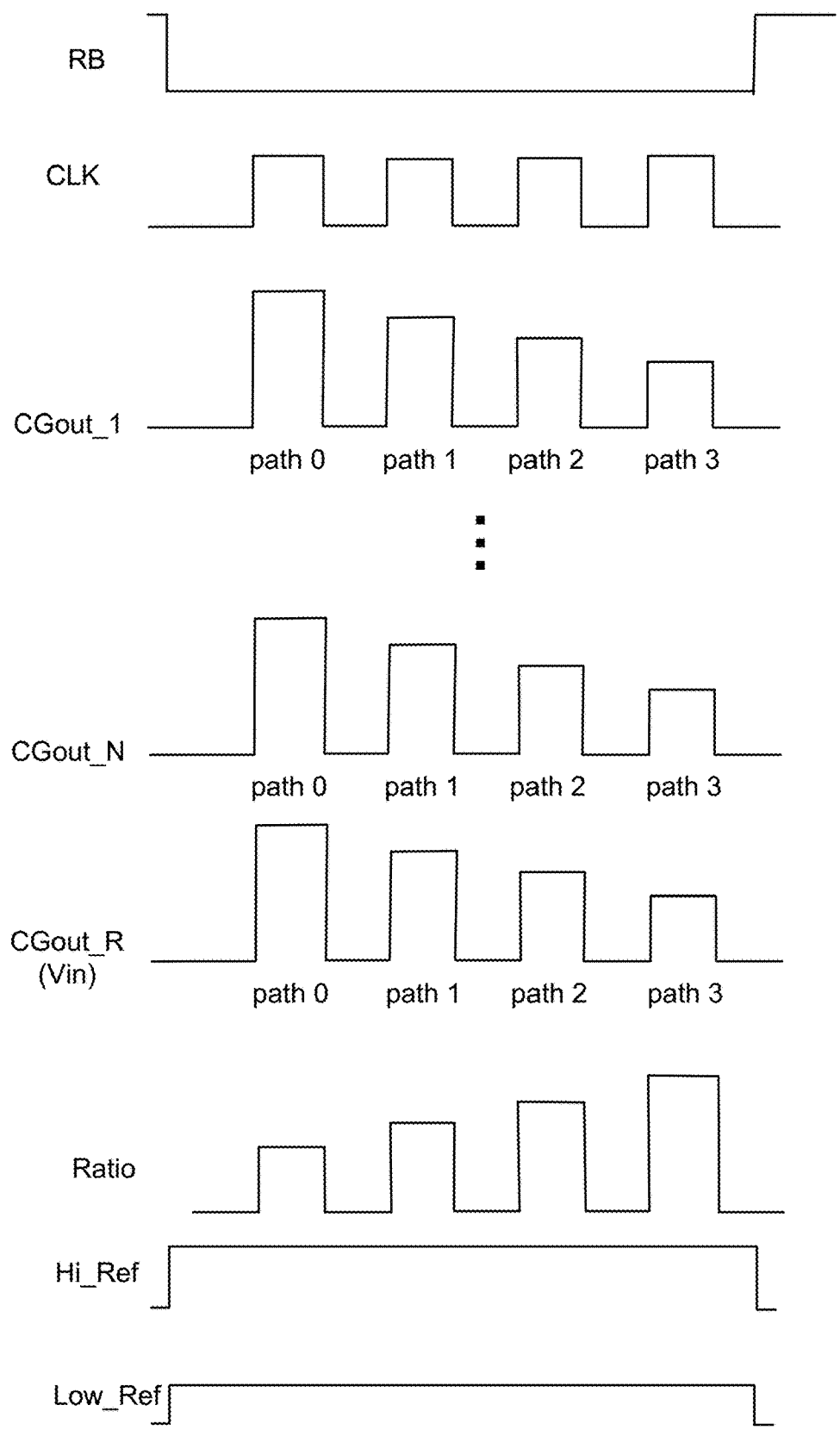
FIGS. 17A and 17B are timing diagrams of various signals when testing for a defective regular control gate driver.
Figure 17B:
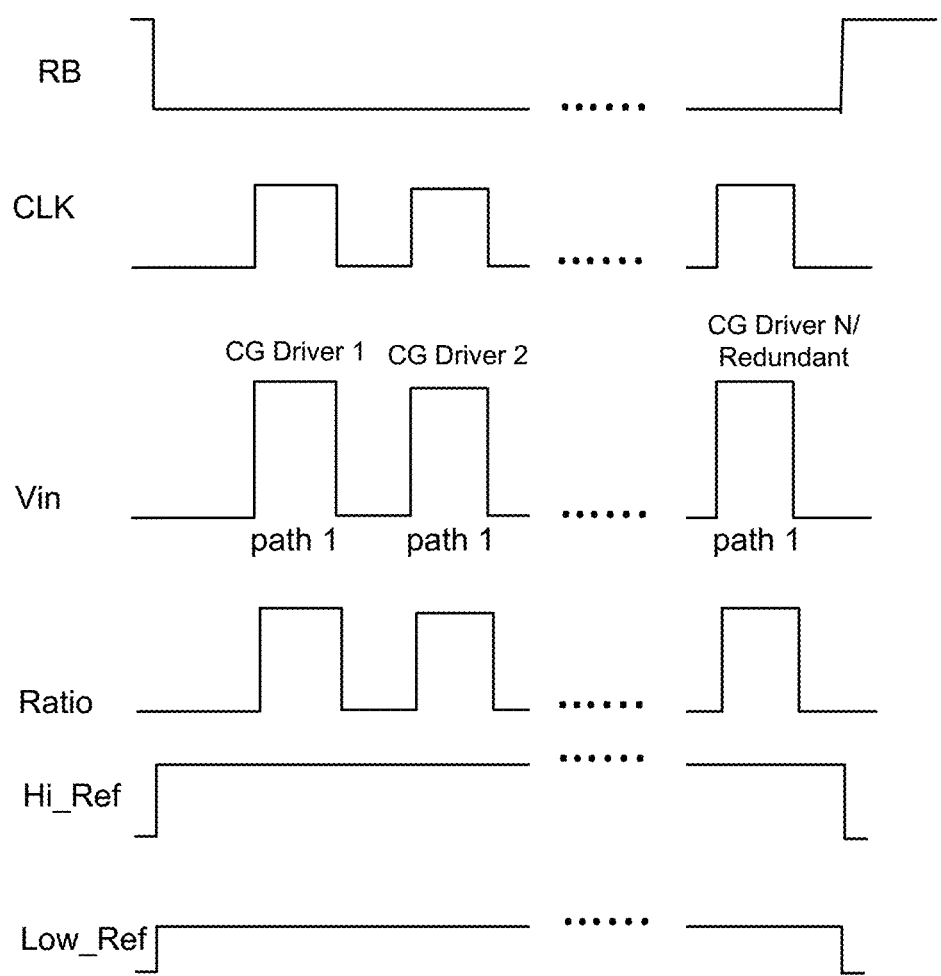

FIGS. 17A and 17B are timing diagrams of various signals when testing for a defective regular control gate driver using the structure of FIG. 16. FIG. 17A depicts signals RB, CLK, CGout_1, CGout-N, CGout_R, Ratio, Hi_Ref and Low_Ref. FIG. 17A is an embodiment where all of the voltage paths 0 for all of the control gate drivers are tested concurrently, all of the voltage paths 1 for all of the control gate drivers are tested concurrently, all of the voltage paths 2 for all of the control gate drivers are tested concurrently, and all of the voltage paths 3 for all of the control gate drivers are tested concurrently. Since all of the voltage paths 0 receive the same source of voltage, if any of the voltage paths 0 has a defect then the magnitude of the voltage received at the other non-defective paths 0 will change. For example, if one of the control gate drivers is defective, that defective control gate driver may pull down the voltage supply, thereby lowering the magnitude of the voltage received at the other non-defective paths. This applies to path 1, path 2 and path 3 as well. Therefore, only one of the control gate drivers needs to be tested by the comparators 1308 and 1310. In one example, the multiplexer 1302 will select the voltage paths from the redundant control gate driver as a representative of all control gate drivers. If any of path 0-path 3 fail the test, then the control circuit knows that one of the control gate drives has a defective path. For example, if Vin is below Low_Ref for path 1 of the redundant control gate driver, then the system knows that at least one of the control gate drivers has a defective path 1. The process of FIG. 17B tests to determine which of the control gate drivers has the defective path 1. FIG. 17A depicts signals RB, CLK, Vin, Hi_Ref and Low_Ref. In this example, Vin is the path 1 signal form each control gate driver. With each new CLK pulse, the multiplexer 1302 switches to select the next control gate driver and each control gate driver is configured to provide its path 1. The embodiment of FIGS. 17A and 17B performs the testing faster than the embodiment of FIG. 14.

A non-volatile memory system has been described that includes one or more redundant control gate drivers to replace a defective control gate driver in order to prevent the non-volatile memory system from becoming inoperable due to the defective control gate driver.

One embodiment includes a non-volatile storage apparatus, comprising: non-volatile memory cells; word lines connected to the non-volatile memory cells; a set of regular control gate drivers; a plurality of switches connected to the word lines and the regular control gate drivers; and a redundant control gate driver connected to the plurality of switches. Each regular control gate driver of the set of regular control gate drivers is capable of outputting a plurality of output voltages such that a first subset of the set of regular control gate drivers are configured to output a first plurality of output voltages and a second subset of the set of regular control gate drivers are configured to output a second plurality of output voltages. The first plurality of output voltages includes one or more different voltages than the second plurality of output voltages. The redundant control gate driver is configured to output the first plurality of output voltages and the second plurality of output voltages. The plurality of switches are configured to selectively replace any one of the regular control gate drivers of the set of regular control gate drivers with the redundant control gate driver.

In one example implementation, a control circuit is connected to the set of regular control gate drivers, the redundant control gate driver, and the plurality of switches. The control circuit is configured to operate the plurality of switches to selectively replace any one of the regular control gate drivers of the set of regular control gate drivers with the redundant control gate driver. The control circuit is configured to automatically detect that a particular regular control gate driver of the set of regular control gate drivers is defective (see e.g., FIGS. 11 and 12) and operate the redundant control gate driver and the plurality of switches to replace the particular regular control gate driver with the redundant control gate driver. The redundant control gate driver is capable of driving all voltages driven by any of the regular control gate drivers it replaces.

In one example implementation, the non-volatile storage apparatus further comprises bit lines, a memory die and a control die. The non-volatile memory cells arranged as a plurality of vertical NAND strings connected to the word lines and the bit lines. The non-volatile memory cells are positioned on the memory die. The word lines and the bit lines are positioned on the memory die. The control die that is bonded to the memory die. The regular control gate drivers and the redundant control gate driver are positioned on the control die. The plurality of switches are positioned on the control die.

One embodiment includes a method for operating non-volatile storage, comprising testing a set of regular control gate drivers. Each regular control gate driver of the set of regular control gate drivers receives multiple different sources of voltage and comprises multiple voltage paths including a different voltage path connected to each of the received multiple different sources of voltage. The testing comprises separately testing each voltage path of each regular control gate driver of the set of regular control gate drivers by driving a respective source of voltage through the respective voltage path and comparing an output for the respective control gate driver to an upper reference and a lower reference for each voltage path of each regular control gate driver of the set of regular control gate drivers, and determining that a particular regular control gate driver of the set of regular control gate drivers is defective because an output for the particular regular control gate driver is either above the upper reference or below the lower reference when driving at least one source of voltage through at least one of the voltage paths for the particular regular control gate driver. The method further comprises replacing the particular regular control gate driver with a redundant control gate driver that is connected to the sources of voltage connected to the particular regular control gate driver by selectively connecting the redundant control gate driver to the output for the particular regular control gate driver and disconnecting the particular regular control gate driver from the output for the particular regular control gate driver.

One embodiment includes a non-volatile storage apparatus, comprising: a non-volatile memory structure comprising non-volatile memory cells, word lines connected to the non-volatile memory cells and bit lines connected to the non-volatile memory cells; a set of regular control gate drivers, each regular control gate driver of the set of regular control gate drivers receives multiple different sources of voltage and comprises multiple voltage paths including a different voltage path connected to each of the received multiple different sources of voltage; a plurality of switches connected to the word lines and the regular control gate drivers, each control gate driver of the set of control gate drivers is connected to only a subset of the word lines via the plurality of switches; a redundant control gate driver connected to the plurality of switches, the redundant control gate driver is connected to all of the word lines and selectively in electrical communication with a selectable subset of the word lines; a control circuit connected to the set of regular control gate drivers, the redundant control gate driver, the bit lines and the plurality of switches; and a data structure separately indicating whether each path of each control gate driver of the set of control gate drivers is defective, the control circuit is configured to operate the redundant control gate driver and the plurality of switches to selectively replace any one of the regular control gate drivers of the set of regular control gate drivers with the redundant control gate driver based on the data structure.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
non-volatile memory cells;
word lines connected to the non-volatile memory cells;
a set of regular control gate drivers, each regular control gate driver of the set of regular control gate drivers is capable of outputting a plurality of output voltages such that a first subset of the set of regular control gate drivers are configured to output a first plurality of output voltages and a second subset of the set of regular control gate drivers are configured to output a second plurality of output voltages, the first plurality of output voltages includes one or more different voltages than the second plurality of output voltages;
a plurality of switches connected to the word lines and the regular control gate drivers;
a redundant control gate driver connected to the plurality of switches, the redundant control gate driver is configured to output the first plurality of output voltages and the second plurality of output voltages, the plurality of switches are configured to selectively replace any one of the regular control gate drivers of the set of regular control gate drivers with the redundant control gate driver; and
a control circuit connected to the set of regular control gate drivers, the redundant control gate driver, and the plurality of switches;
the control circuit is configured to operate the plurality of switches to selectively replace any one of the regular control gate drivers of the set of regular control gate drivers with the redundant control gate driver;
the control circuit is configured to automatically detect that a particular regular control gate driver of the set of regular control gate drivers is defective and operate the redundant control gate driver and the plurality of switches to replace the particular regular control gate driver with the redundant control gate driver.

2. The non-volatile storage apparatus of claim 1, wherein:
the control circuit is configured to replace a particular regular control gate driver determined to be defective with the redundant control gate driver by selectively connecting the redundant control gate driver to the output for the particular regular control gate driver and disconnecting the particular regular control gate driver from the output for the particular regular control gate driver.

3. The non-volatile storage apparatus of claim 1, wherein:
each regular control gate driver of the set of regular control gate drivers receives multiple different sources of voltage and comprises multiple voltage paths including a different voltage path connected to each of the received multiple different sources of voltage; and
the control circuit is configured to test the set of regular control gate drivers by:
separately testing each voltage path of each regular control gate driver of the set of regular control gate drivers by driving a respective source of voltage through the respective voltage path and comparing an output for the respective control gate driver to an upper reference voltage and a lower reference voltage for each voltage path of each regular control gate driver of the set of regular control gate drivers, and
determining that a particular regular control gate driver of the set of regular control gate drivers is defective because if an output for the particular regular control gate driver is either above the upper reference or below the lower reference when driving at least one source of voltage through at least one of the voltage paths for the particular regular control gate driver.

4. The non-volatile storage apparatus of claim 3, wherein the control circuit comprising a testing circuit that is configured to test the set of regular control gate drivers, the testing circuit comprises:
a multiplexer circuit connected to each voltage path of each regular control gate driver of the set of regular control gate drivers;
a dynamically configurable voltage divider connected to an output of the multiplexer circuit, the voltage divider has a voltage divider ratio indicating the fraction of the voltage output;
a first comparator having a first input connected to an output of the voltage divider and a second input connected to the upper reference voltage; and
a second comparator having a first input connected to the output of the voltage divider and a second input connected to the lower reference voltage;
for each of the voltage paths, the control circuit is configured to dynamically adjust the voltage divider so that the voltage divider ratio varies to divide a respective voltage from a respective voltage path to be within the upper reference voltage and lower reference voltage if no defect exists for the respective voltage path.

5. The non-volatile storage apparatus of claim 1, further comprising:
a data structure, each regular control gate driver of the set of regular control gate drivers receives multiple different sources of voltage and comprises multiple voltage paths including a different voltage path connected to each of the received multiple different sources of voltage, the data structure separately indicates whether each path of each control gate driver of the set of control gate drivers is defective, the control circuit is configured to operate the redundant control gate driver and the plurality of switches to selectively replace any one of the regular control gate drivers of the set of regular control gate drivers with the redundant control gate driver based on the data structure.

6. The non-volatile storage apparatus of claim 1, wherein:
the redundant control gate driver includes multiple inputs that each receive a different source of voltage, multiple voltage paths including a different voltage path for each source of voltage, and a plurality of internal switches including a internal switch for each voltage path; and the control circuit is configured to operate the redundant control gate driver and the plurality of switches to replace any one of the regular control gate drivers of the set of regular control gate drivers with the redundant control gate driver including adjusting one of the internal switches in order to choose one of the sources of voltage for output by the redundant control gate driver.

7. The non-volatile storage apparatus of claim 1, wherein:

the plurality of switches include a plurality of output select switches including one output select switch at an output of each regular control gate driver of the set of regular control gate drivers; and the plurality of switches further include a plurality of replacement switches connected to an output of the redundant control gate driver including one replacement switch connected to an output of each of the output select switches such that the control circuit is configured to replace a particular regular control gate driver with the redundant control gate driver by turning off an output select switch at an output of the particular regular control gate driver and turning on a replacement switch at the output of the output select switch that is at the output of the particular regular control gate driver.

8. The non-volatile storage apparatus of claim 1, wherein:

the redundant control gate driver is capable of driving all voltages driven by any of the regular control gate drivers it replaces.

9. The non-volatile storage apparatus of claim 1, wherein:

each regular control gate driver of the set of regular control gate drivers receives multiple different sources of voltage and comprises multiple voltage paths including a different voltage path connected to each of the received multiple different sources of voltage; and the redundant control gate driver is connected to all of the word lines and selectively in electrical communication with a selectable subset of the word lines.

10. The non-volatile storage apparatus of claim 1, wherein:

the first subset of the set of regular control gate drivers receives a first set of sources of voltage;

the second subset of the set of regular control gate drivers receives a second set of sources of voltage, the first set of sources of voltage is different than the second set of sources of voltage; and the redundant control gate driver receives all of the sources of voltages of the first set of sources of voltage and the second set of sources of voltage.

11. The non-volatile storage apparatus of claim 1, wherein:

a third subset of the set of regular control gate drivers are configured to output a third plurality of output voltages, the first plurality of output voltages are different than the third plurality of output voltages and the second plurality of output voltages are different than the third plurality of output voltages; and the redundant control gate driver is configured to output the third first plurality of output voltages, the second plurality of output voltages and the third plurality of output voltages.

12. The non-volatile storage apparatus of claim 11, wherein:

the first subset of the set of regular control gate drivers are connected to data word lines;

the second subset of the set of regular control gate drivers are connected to dummy word lines; and the third subset of the set of regular control gate drivers are connected to select lines.

13. The non-volatile storage apparatus of claim 11, further comprising:

an additional redundant control gate driver connected to the plurality of switches, the additional redundant control gate driver is configured to output the first plurality of output voltages and the second plurality of output voltages and the third plurality of output voltages, the plurality of switches are configured to selectively replace any one of the regular control gate drivers of the set of regular control gate drivers with the additional redundant control gate driver.

14. The non-volatile storage apparatus of claim 1, further comprising:

bit lines, the non-volatile memory cells arranged as a plurality of vertical NAND strings connected to the word lines and the bit lines;

a memory die, the non-volatile memory cells are positioned on the memory die, the word lines and the bit lines are positioned on the memory die; and a control die that is bonded to the memory die, the regular control gate drivers and the redundant control gate driver are positioned on the control die, the plurality of switches are positioned on the control die.

15. A method for operating non-volatile storage, comprising:

testing a set of regular control gate drivers, each regular control gate driver of the set of regular control gate drivers receives multiple different sources of voltage and comprises multiple voltage paths including a different voltage path connected to each of the received multiple different sources of voltage, the testing comprises:

separately testing each voltage path of each regular control gate driver of the set of regular control gate drivers by driving a respective source of voltage through the respective voltage path and comparing an output for the respective control gate driver to an upper reference and a lower reference for each voltage path of each regular control gate driver of the set of regular control gate drivers, and determining that a particular regular control gate driver of the set of regular control gate drivers is defective because an output for the particular regular control gate driver is either above the upper reference or below the lower reference when driving at least one source of voltage through at least one of the voltage paths for the particular regular control gate driver; and replacing the particular regular control gate driver with a redundant control gate driver that is connected to the sources of voltage connected to the particular regular control gate driver by selectively connecting the redundant control gate driver to the output for the particular regular control gate driver and disconnecting the particular regular control gate driver from the output for the particular regular control gate driver.

16. The method of claim 15, wherein:

the replacing the particular regular control gate driver with the redundant control gate driver comprises configuring a plurality of switches including turning off an output switch at the output for the particular regular control gate driver and turning on a replacement switch connected to the output switch.

17. The method of claim 16, wherein:
the redundant control gate driver includes multiple inputs that each receive a different source of voltage, multiple voltage paths including a different voltage path for each source of voltage, and an internal switch for each voltage path; and
the replacing the particular regular control gate driver with the redundant control gate driver further comprises adjusting one of the internal switches in order to choose one of the sources of voltage.

18. A non-volatile storage apparatus, comprising:
a non-volatile memory structure comprising non-volatile memory cells, word lines connected to the non-volatile memory cells and bit lines connected to the non-volatile memory cells;
a set of regular control gate drivers, each regular control gate driver of the set of regular control gate drivers receives multiple different sources of voltage and comprises multiple voltage paths including a different voltage path connected to each of the received multiple different sources of voltage;
a plurality of switches connected to the word lines and the regular control gate drivers, each control gate driver of the set of control gate drivers is connected to only a subset of the word lines via the plurality of switches;
a redundant control gate driver connected to the plurality of switches, the redundant control gate driver is connected to all of the word lines and selectively in electrical communication with a selectable subset of the word lines;
a control circuit connected to the set of regular control gate drivers, the redundant control gate driver, the bit lines and the plurality of switches; and
a data structure separately indicating whether each voltage path of each control gate driver of the set of control gate drivers is defective, the control circuit is configured to operate the redundant control gate driver and the plurality of switches to selectively replace any one of the regular control gate drivers of the set of regular control gate drivers with the redundant control gate driver based on the data structure.

* * * * *